United States Patent
Saito et al.

(10) Patent No.: US 7,483,291 B2
(45) Date of Patent: *Jan. 27, 2009

(54) MAGNETO-RESISTANCE EFFECT ELEMENT, MAGNETIC MEMORY AND MAGNETIC HEAD

(75) Inventors: Yoshiaki Saito, Kanagawa-Ken (JP); Katsuya Nishiyama, Kanagawa-Ken (JP); Shigeki Takahashi, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 565 days.

This patent is subject to a terminal disclaimer.

(21) Appl. No.: 11/202,318

(22) Filed: Aug. 12, 2005

(65) Prior Publication Data
US 2006/0034118 A1 Feb. 16, 2006

Related U.S. Application Data

(62) Division of application No. 10/715,545, filed on Nov. 19, 2003, now Pat. No. 6,956,765.

(30) Foreign Application Priority Data
Nov. 22, 2002 (JP) .............................. 2002-339934

(51) Int. Cl.
*G11C 11/00* (2006.01)
(52) U.S. Cl. ...................... 365/158; 365/171; 365/173
(58) Field of Classification Search .................. 365/158, 365/171, 173
See application file for complete search history.

(56) References Cited

U.S. PATENT DOCUMENTS

| 5,659,499 | A  | * | 8/1997  | Chen et al. |
| 5,940,319 | A  | * | 8/1999  | Durlam et al. |
| 5,953,248 | A  | * | 9/1999  | Chen et al. |
| 5,956,267 | A  | * | 9/1999  | Hurst et al. |
| 5,966,012 | A  | * | 10/1999 | Parkin |
| 5,966,323 | A  | * | 10/1999 | Chen et al. |
| 6,767,655 | B2 | * | 7/2004  | Hiramoto et al. |
| 6,956,765 | B2 | * | 10/2005 | Saito et al. ................... 365/158 |
| 7,145,796 | B2 | * | 12/2006 | Fukuzumi et al. ............ 365/158 |
| 7,239,539 | B2 | * | 7/2007  | Moriyama et al. ........... 365/158 |
| 2002/0055016 | A1 | * | 5/2002 | Hiramoto et al. |
| 2004/0136231 | A1 | * | 7/2004 | Huai et al. |

FOREIGN PATENT DOCUMENTS

| CN | 1340867 A | * | 3/2002 |
| JP | 9-251621 |  * | 9/1997 |
| JP | 2001-156358 | * | 6/2001 |
| JP | 2004-111887 | * | 4/2004 |

\* cited by examiner

*Primary Examiner*—Pho M. Luu
(74) *Attorney, Agent, or Firm*—Oblon, Spivak, McClelland, Maier & Neustadt, P.C.

(57) ABSTRACT

A magneto-resistance effect element includes: a first ferromagnetic layer serving as a magnetization fixed layer; a magnetization free layer including a second ferromagnetic layer provided on one side of the first ferromagnetic layer, a third ferromagnetic layer which is formed on an opposite side of the second ferromagnetic layer from the first ferromagnetic layer and has a film face having an area larger than that of the second ferromagnetic layer and whose magnetization direction is changeable by an external magnetic field, and an intermediate layer provided between the second ferromagnetic layer and the third ferromagnetic layer; and a tunnel baffler layer provided between the first ferromagnetic layer and the second ferromagnetic layer. The second ferromagnetic layer and the third ferromagnetic layer are magnetically coupled via the intermediate layer, and an aspect ratio of a plane shape of the third ferromagnetic layer is within a range from 1 to 2.

23 Claims, 33 Drawing Sheets

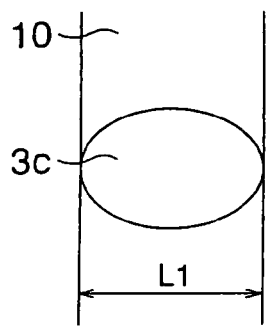 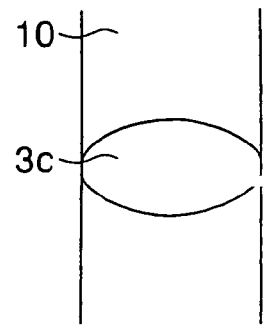 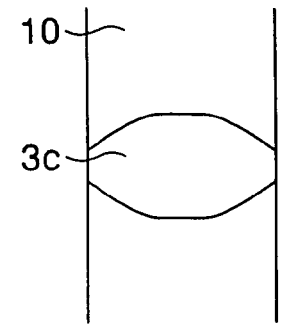
FIG. 11A  FIG. 11B  FIG. 11C
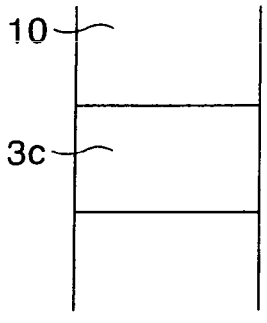 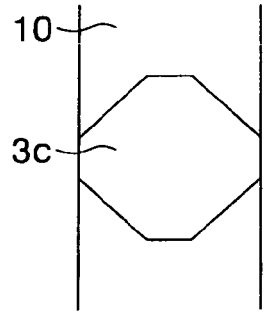 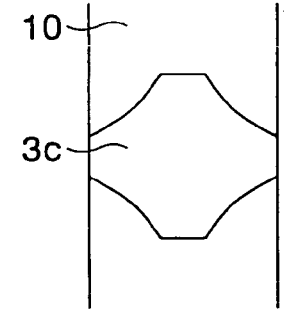
FIG. 11D  FIG. 11E  FIG. 11F
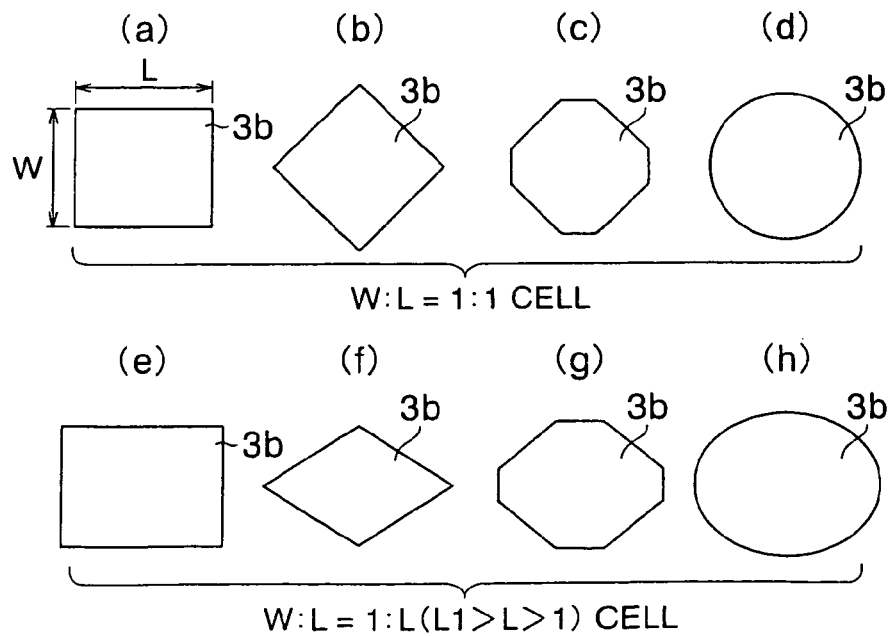
FIG. 12

$g_3$ : WRONG ASTEROID CURVE
$g_2$ : ORDINARY ASTEROID CURVE
$g_1$ : EXCELLENT ASTEROID CURVE

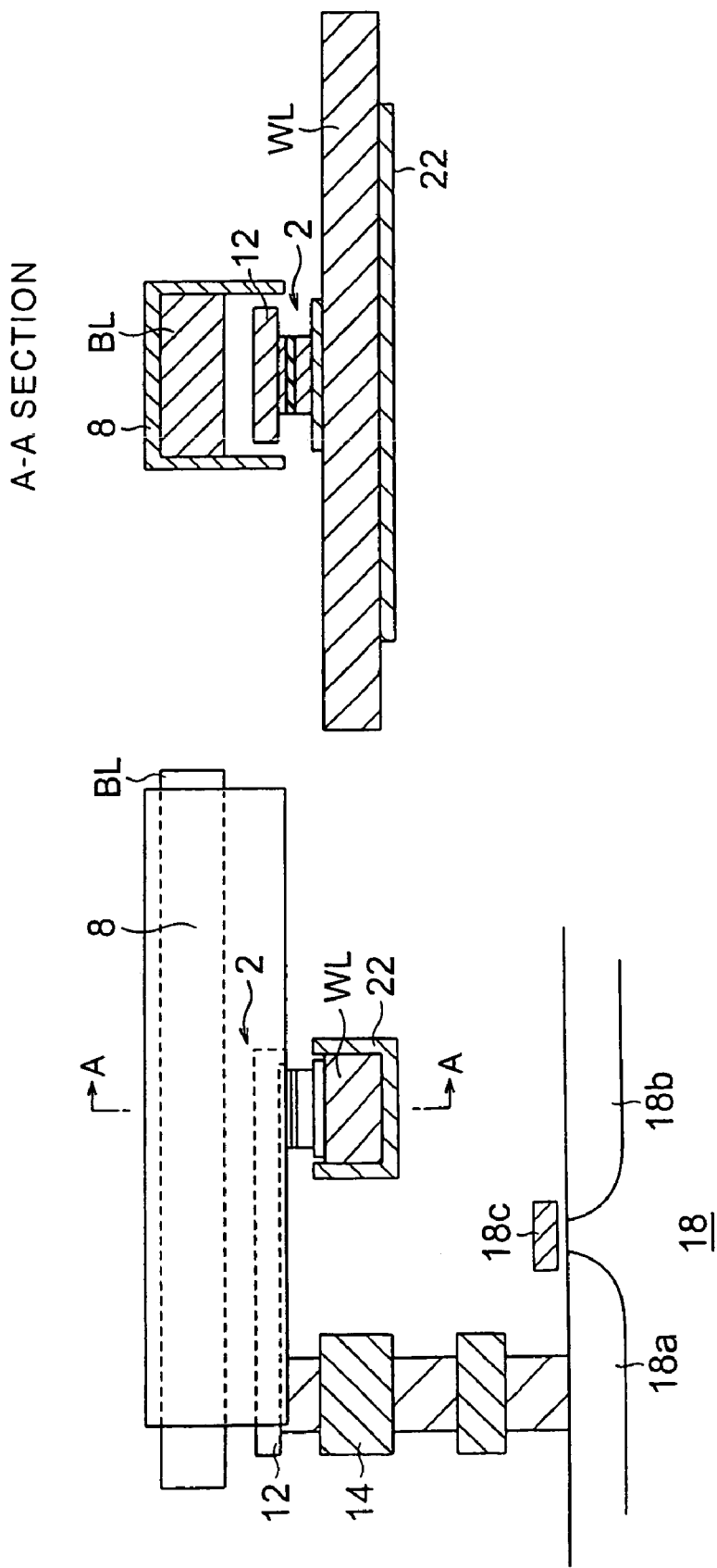

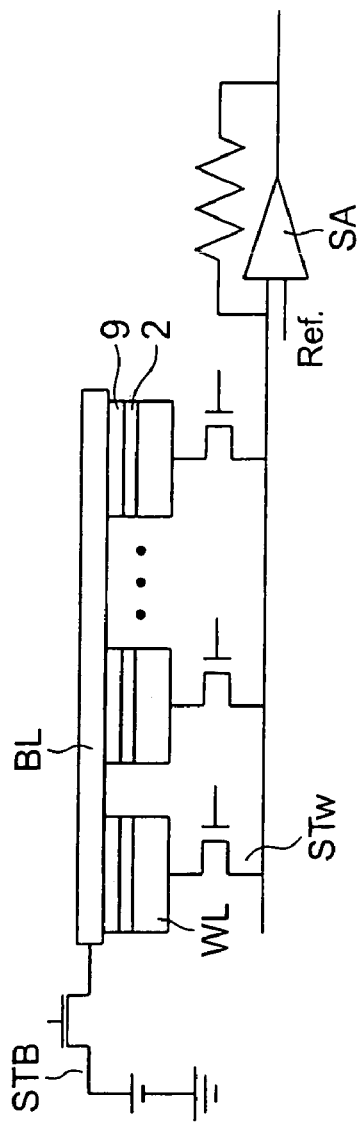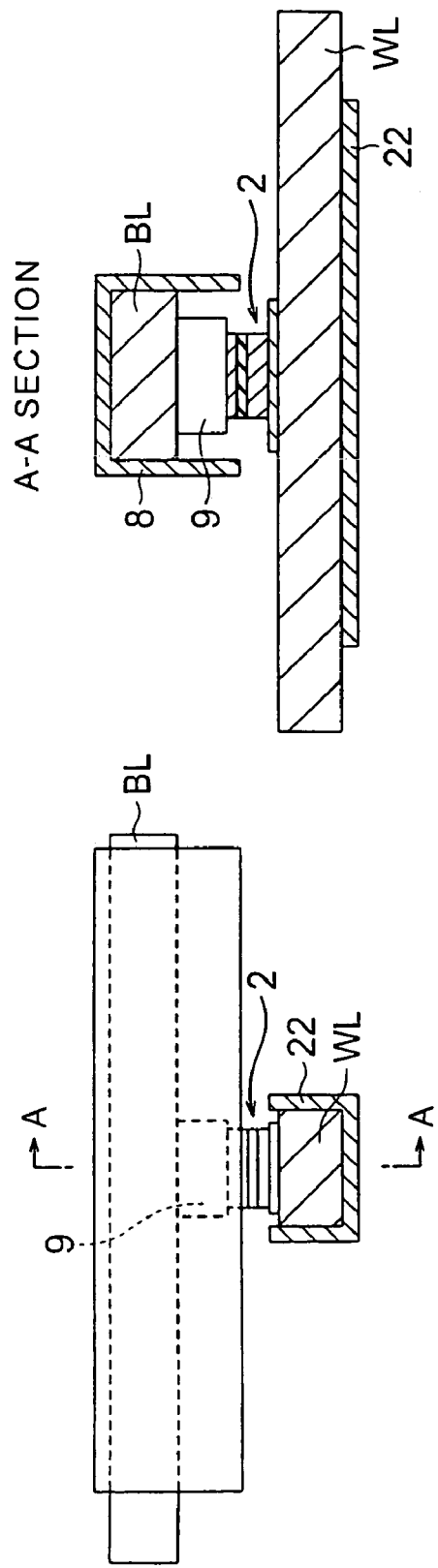

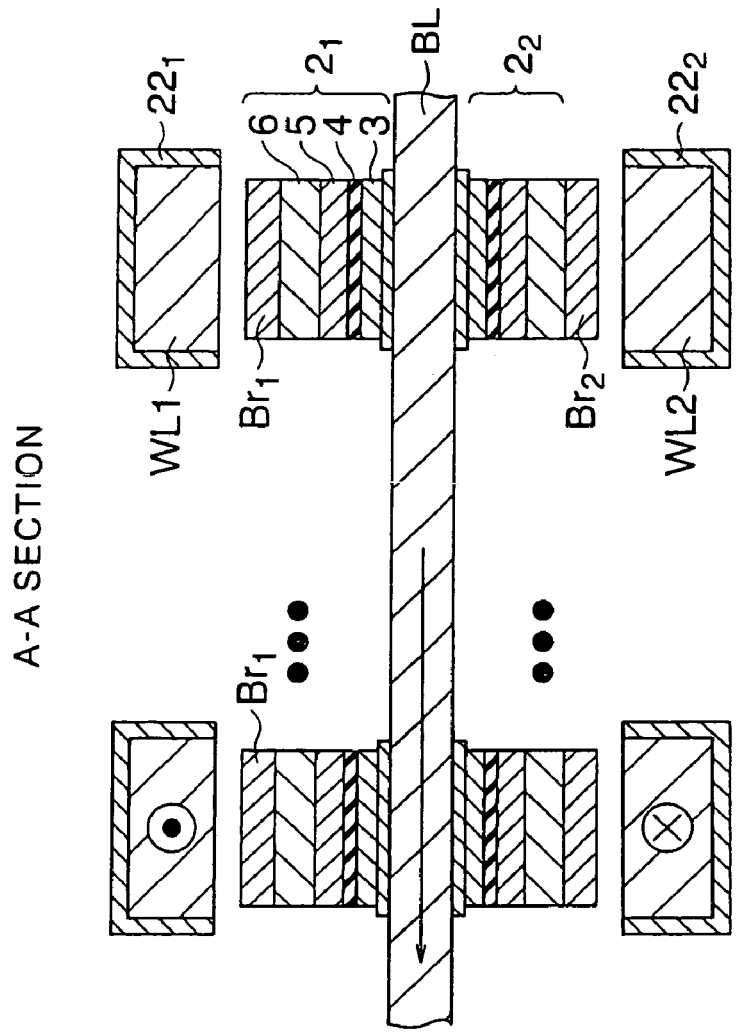
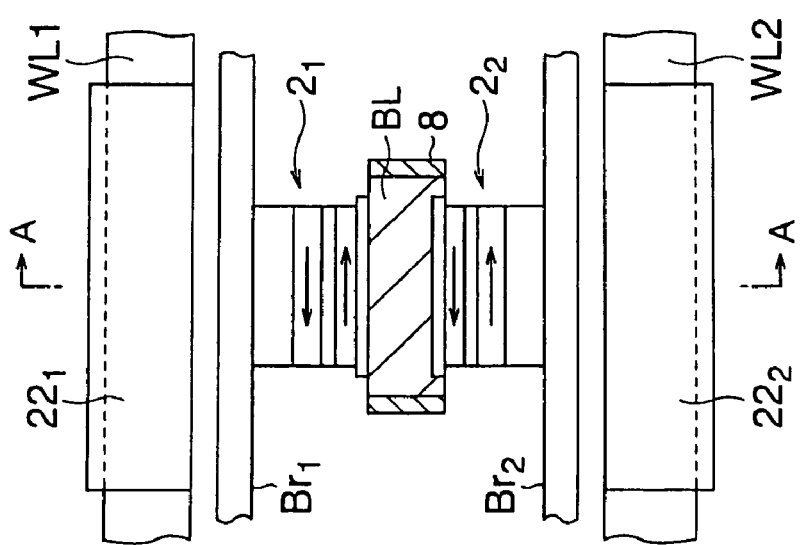
FIG. 19B
FIG. 19A

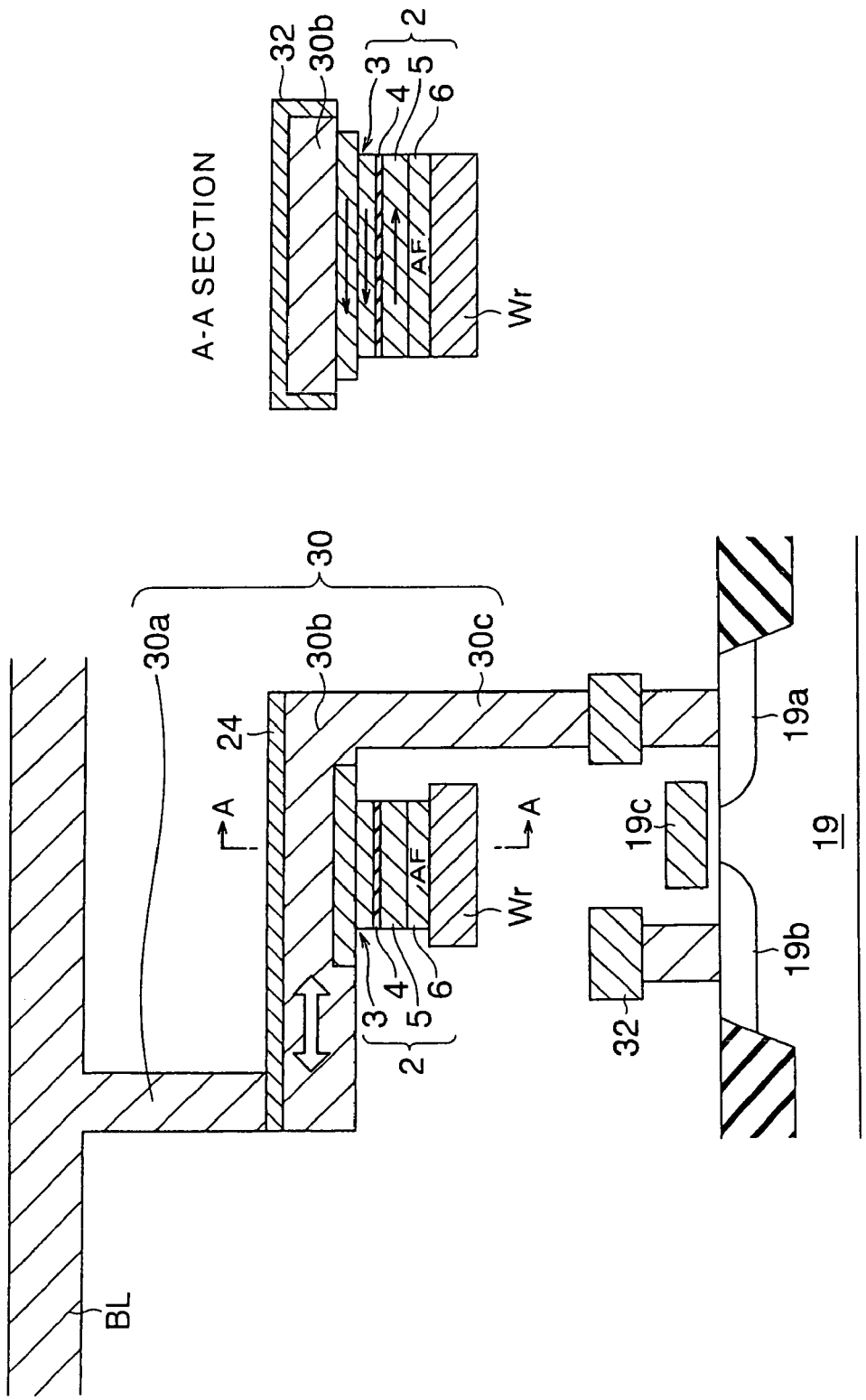

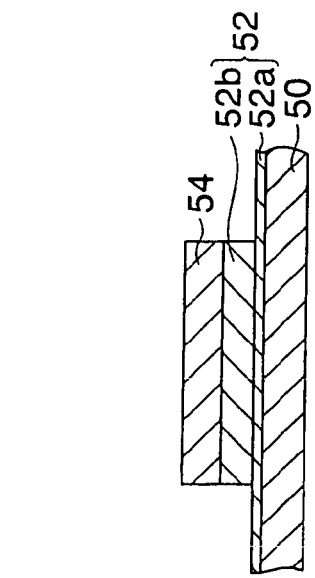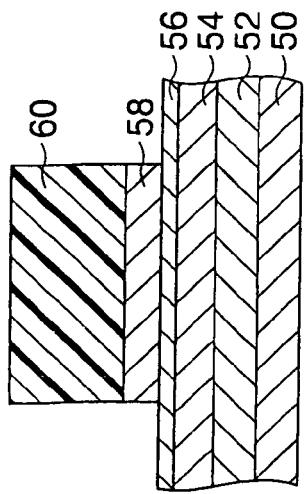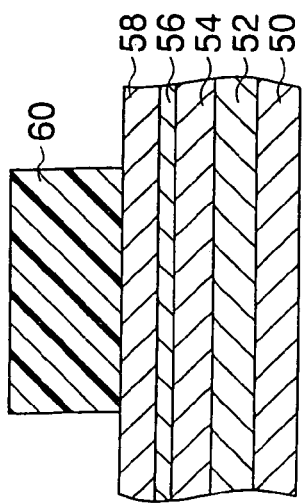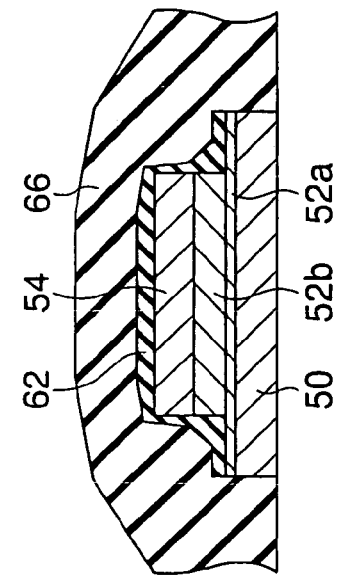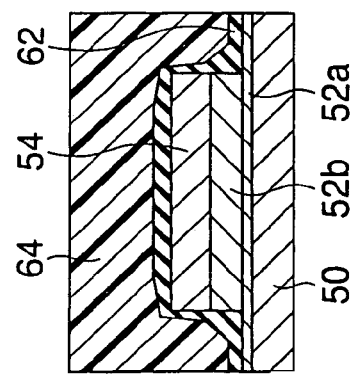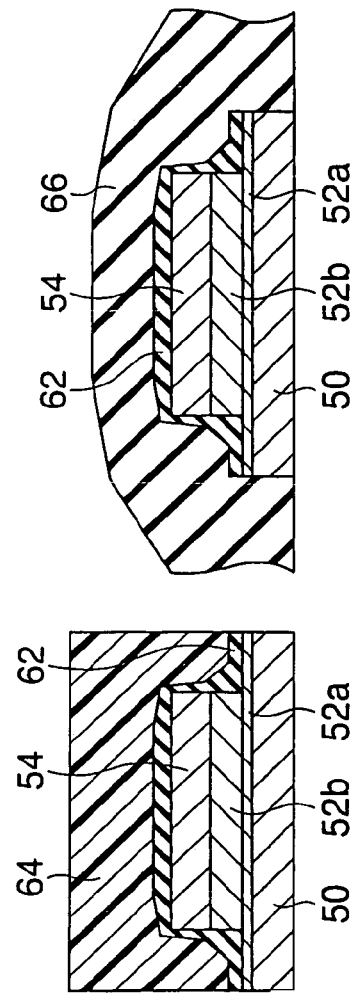



MAGNETO-RESISTANCE EFFECT ELEMENT, MAGNETIC MEMORY AND MAGNETIC HEAD

CROSS-REFERENCE TO RELATED APPLICATIONS

This application is a division of and claims the benefit of priority under 35 USC §120 from U.S. application Ser. No. 10/715,545, filed Nov. 19, 2003, and is based upon and claims the benefit of priority from prior Japanese Patent Application No. 2002-339934, filed on Nov. 22, 2002 in Japan, the entire contents of which are incorporated herein by reference.

FIELD OF THE INVENTION

The present invention relates to a magneto-resistance effect element, a magnetic memory and a magnetic head.

RELATED ART

A magneto-resistance effect element having magnetic films is used for a magnetic head, a magnetic sensor and so forth, and it has been proposed to be used for a solid magnetic memory. In particular, there is an increasing interest in a magnetic random access memory (hereinafter, referred to as "MRAM (Magnetic Random Access Memory)), which utilizes the magneto-resistance effect of ferromagnetic material, as a next generation solid non-volatile memory capable of carrying out a rapid reading/writing and an operation with large capacity and low power consumption.

In recent years, a ferromagnetic tunnel junction element or the so-called "tunneling magneto-resistance element (TMR element)" has been proposed as a magneto-resistance effect element utilizing a tunnel current and having a sandwiching structure where one dielectric is inserted between two ferromagnetic metal layers, and a current is caused to flow perpendicular to a film face to utilize a tunneling current. In the tunneling magneto-resistance element, since a magneto-resistance change ratio (MR ratio) has reached 20% or more, a possibility of the MRAM to public application is increasing.

The tunneling magneto-resistance element can be realized by deposing a thin Al (aluminum) layer with a thickness of 0.6 nm to 2.0 nm on a ferromagnetic layer, and thereafter, exposing the surface of the Al layer to oxygen glow discharge or oxygen gas to form a tunnel barrier layer comprising $Al_2O_3$.

Further, a ferromagnetic single tunnel junction having a structure where a magnetization direction of one of ferromagnetic layers constituting the ferromagnetic single tunnel junction element is fixed by an anti-ferromagnetic layer has been proposed.

Furthermore, a tunneling magneto-resistance element where magnetic particles have been dispersed in a dielectric and a ferromagnetic dual tunnel junction element have been proposed.

In view of the fact that a magneto-resistance change ratio in a range of 20% to 50% have been also achieved in these tunneling magneto-resistance elements and the fact that reduction in magneto-resistance change ratio can be suppressed even if a voltage value to be applied to a tunneling magneto-resistance element is increased in order to obtain a desired output voltage value, there is a possibility of the TMR element to application to the MRAM.

When the TMR element is used in the MRAM, one of two ferromagnetic layers sandwiching a tunnel barrier layer, i.e., a magnetization fixed layer whose magnetization direction is fixed so as not to change is defined as a magnetization reference layer, and the other thereof, i.e., a magnetization free layer whose magnetization direction is constituted to be easily reversed is defined as a storage layer. Information or data can be stored by causing a parallel state where the magnetization directions of the reference layer and the storage layer are parallel and an anti-parallel state where they are anti-parallel to correspond to "0" and "1" of binary information.

A writing operation of record information is performed by inverting the magnetization direction in the storage layer by an induced magnetic field generated by causing current to flow in a writing wire provided in the vicinity of the TMR element. Further, a reading operation of record information is conducted by detecting a resistance change amount due to a TMR effect.

For the purpose of fixing the magnetization direction in the reference layer, such a method that an anti-ferromagnetic layer is provided so as to come in contact with a ferromagnetic layer so that occurrence of inverting magnetization is made hard by the exchange coupling force is employed, and such a structure is called a spin valve type structure. In this structure, the magnetization direction of the reference layer is determined by annealing while applying a magnetic field (magnetization fixing annealing). On the other hand, the storage layer is formed such that a magnetization easy axis of the storage layer and the magnetization direction of the reference layer are made approximately equal to each other by applying a magnetic anisotropy.

A magnetic recording element using the ferromagnetic single tunnel junction or the ferromagnetic dual tunnel junction has such a characteristic that writing/reading time can be conducted at a high speed such as 10 nanoseconds or less, even if it is non-volatile, and it has a potential such that the number of rewritings is $10^{15}$ or more. In particular, as described above, in the magnetic recording element using the ferromagnetic dual tunnel junction element, even if a voltage value to be applied to the tunneling magneto-resistance element is increased in order to obtain a desired output voltage value, reduction in magneto-resistance change rate can be suppressed so that a large output voltage can be obtained. Thus, a preferable characteristic can be developed as the magnetic recording element.

However, regarding a cell size of the memory, when an architecture where a cell is constituted by one transistor and one TMR element is used, there occurs such a problem that the cell can not be reduced down to the size of a DRAM (Dynamic Random Access Memory) of a semiconductor device or smaller.

In order to solve this problem, a diode type architecture where a TMR element and a diode are connected in series between a bit line and a word line and a simple matrix type architecture where a cell having a TMR element is disposed between a bit line and a word line have been proposed.

However, in the both cases, since reversal is conducted with a current magnetic field due to current pulses at a writing time into a storage layer, power consumption is large. Further, since an allowable current density in a wire when a mass storage is to be achieved is limited, the mass storage can not be achieved. Furthermore, unless an absolute value of a current flow is 1 mA or less, an area of a driver for allowing a current to flow becomes large. There occurs such a problem that the memory becomes large in chip size, as compared with another non-volatile solid magnetic memory, for example, a ferroelectric random access memory using a ferrodielectric material capacitor, a flush memory or the like, so that a competitive power of the memory is lost.

In order to solve the above problem, magnetic storage devices where a thin film comprising magnetic material with a high magnetic permeability is provided about a writing wire have been proposed (refer to U.S. Pat. Nos. 5,659,499; 5,956,267; and U.S. Pat. No. 5,940,319). According to these magnetic storage devices, since a magnetic film with a high magnetic permeability is provided about a wire, a current value required for information writing in a magnetic recording layer can be reduced efficiently.

However, even if these magnetic storage devices are used, it has been much difficult to suppress the writing current value to 1 mA or less.

Further, storage layers (magnetization free layer) of a ferromagnetic tunneling junction which have been conventionally proposed are usually determined according to their volumes defined at a time of junction separation, and there occurs a problem about thermal stability when the design rule becomes 0.25 μm or less. In order to solve the above problems, it has been proposed to form a three-layered film or a multi-layered film where a storage layer has been joined in an anti-ferromagnetic coupling (for example, refer to U.S. Pat. No. 5,953,248).

However, when a structure of the multi-layered film disclosed in U.S. Pat. No. 5,953,248 is employed, such a problem arises that a multi-hysteresis occurs and an MR change rate lowers.

SUMMARY OF THE INVENTION

The present invention has been made in view of the above-described circumstances and an object thereof is to provide a magneto-resistance effect element whose power consumption is reduced and thermal stability is excellent, a magnetic memory using the magneto-resistance effect element and a magnetic head using the same.

A magneto-resistance effect element according to a first aspect of the present invention includes: a first ferromagnetic layer serving as a magnetization fixed layer; a magnetization free layer including a second ferromagnetic layer provided on one side of the first ferromagnetic layer, a third ferromagnetic layer which is formed on an opposite side of the second ferromagnetic layer from the first ferromagnetic layer and has a film face having an area larger than that of the second ferromagnetic layer and whose magnetization direction is changeable by an external magnetic field, and an intermediate layer which is provided between the second ferromagnetic layer and the third ferromagnetic layer and which transmits a change of magnetization direction of the third ferromagnetic layer to the second ferromagnetic layer; and a tunnel barrier layer provided between the first ferromagnetic layer and the second ferromagnetic layer.

A magneto-resistance effect element according to a second aspect of the present invention includes: a first ferromagnetic layer serving as a magnetization fixed layer; a magnetization free layer which is provided on one side of the first ferromagnetic layer, the magnetization free layer having a T-shape in a section perpendicular to a film face thereof taken along a magnetization easy axis of the magnetization free layer; and a tunnel barrier layer provided between the first ferromagnetic layer and the magnetization free layer.

A magnetic memory according to a third aspect of the present invention includes a first wiring, a second wiring crossing the first wiring and a magneto-resistance effect element according to the first aspect, which is provided in a crossing region of the first and second wirings, wherein the second and third ferromagnetic layers of the magneto-resistance effect element constitute a storage layer whose magnetization direction is changeable according to a magnetic field generated by causing a current to flow in at least one wiring of the first and second wirings, and the third ferromagnetic layer is provided adjacent to the one wiring generating the magnetic field.

A magnetic memory according a fourth aspect of the present invention includes a first wiring, a second wiring crossing the first wiring and a magneto-resistance effect element according to the second aspect, which is provided in a crossing region of the first and second wirings, wherein the magnetization free layer of the magneto-resistance effect element constitutes a storage layer whose magnetization direction is changeable according to a magnetic field generated by causing a current to flow in at least one wiring of the first and second wirings, and the magnetization free layer is provided adjacent to the one wiring generating the magnetic field.

A magnetic head according to a fifth aspect of the present invention includes a magneto-resistance effect element according to the first aspect as a magnetic reproducing element.

A magnetic head according to a sixth aspect of the present invention includes a magneto-resistance effect element according to the second aspect as a magnetic reproducing element.

BRIEF DESCRIPTION OF THE DRAWINGS

FIGS. 11A to 11F are plan views of magnetic layers of writing wirings of the magneto-resistance effect element according to the first embodiment;

FIGS. 12(a) to 12(h) are plan views of intermediate layers of the magneto-resistance effect element according to the first embodiment;

FIGS. 16A and 16B are views showing a structure of a magnetic memory according to a fourth embodiment of the present invention;

FIGS. 17A to 17C are views showing a structure of a magnetic memory according to a fifth embodiment of the present invention;

FIGS. 19A and 19B are views showing a structure of a magnetic memory according to a seventh embodiment of the present invention;

FIGS. 21A and 21B are views showing a structure of a magnetic memory according to a ninth embodiment of the present invention;

FIGS. 31A to 31F are sectional views showing manufacturing steps of a magneto-resistance effect element according to an nineteenth embodiment of the present invention;

EMBODIMENTS OF THE INVENTION

Embodiments of the present invention will be explained below with reference to the drawings.

First Embodiment

Figure 1:
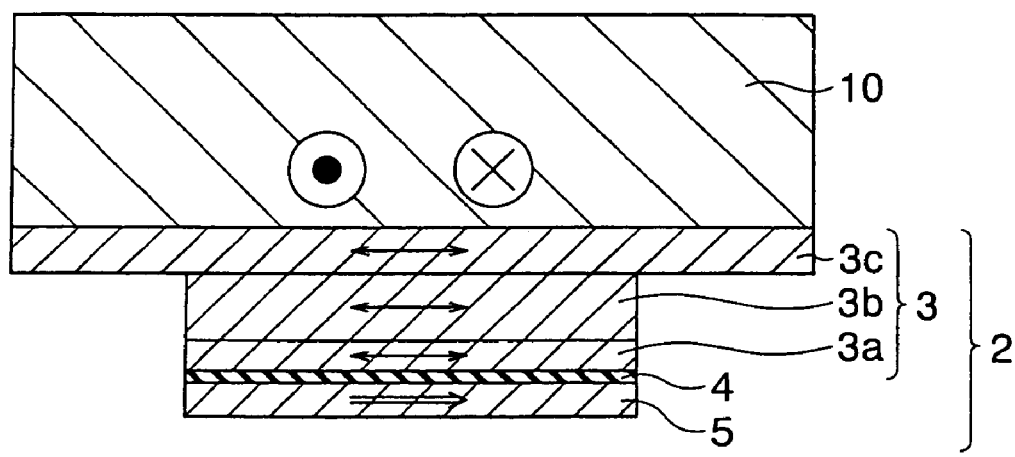
FIG. 1 is a sectional view showing a structure of a magneto-resistance effect element according to a first embodiment of the present invention.

A structure of a magneto-resistance effect element according to a first embodiment of the present invention will be shown in FIG. 1. A magneto-resistance effect element 2 of this embodiment is a ferromagnetic tunneling junction element (hereinafter, also referred to as "TMR element") used in a memory cell of a magnetic memory and comprises a magnetization free layer 3, a tunnel barrier layer 4 and a magnetization fixed layer 5 which serves as a reference layer. The magnetization free layer 3 comprises a ferromagnetic layer 3a serving as a storage layer provided on a side of the tunnel barrier layer 4 opposed to the magnetization fixed layer 5, an intermediate layer 3b and a magnetic layer 3c magnetically exchange coupled via the intermediate layer 3b. The magnetic layer 3c is provided adjacent to a writing wiring 10 in which a writing current flows when writing data or information is written in the TMR element 2.

In this embodiment, such a structure is employed that the ferromagnetic layer 3a, the intermediate layer 3b, the tunnel barrier layer 4 and the magnetization fixed layer 5 have substantially the same plane configuration and their aspect ratios (=length in an longitudinal axis/length of a short axis) are 2 or less. Further, the magnetic layer 3c adjacent to the writing wiring 10 is constituted so as to be larger in area of a film face than the ferromagnetic layer 3a.

That is, the ferromagnetic layer 3a, the intermediate layer 3b and the magnetic layer 3c eventually form a T-shaped magnetization free layer 3 as viewed in section. In the T-shaped magnetization free layer 3, the direction of magnetic moment is mainly supported by the magnetic layer 3c provided adjacent to the writing wiring 10. That is, magnetic anisotropy is mainly applied to the magnetic layer 3c. On the contrary, magnetic anisotropies of the ferromagnetic layer 3a and the intermediate layer 3b can be controlled so as to be small. This control can easily be attained by controlling respective plane shape of their layers 3a and 3b, as described later. The ferromagnetic layer 3a, the intermediate layer 3b and the magnetic layer 3c are coupled by a magnetic exchange coupling.

In the T-shaped magnetization free layer thus constituted, when a current pulse is caused to flow in the writing wiring 10 and a current magnetic field is applied, because the distance between the writing wiring 10 and the magnetic layer 3c provided adjacent to the writing wiring 10 is very short, the current magnetic field acts on the magnetic layer 3c effectively so that a magnetization of the magnetic layer 3c can be inverted easily with a low current. When a magnetization direction of the magnetic layer 3c provided adjacent to the writing wiring 10 is inverted, the ferromagnetic layer 3a and the intermediate layer 3b whose magnetic anisotropies are set to be smaller than that in the magnetic layer 3c are inverted simultaneously due to the magnetic exchange coupling. That is, the intermediate layer 3b transfers inversion of the magnetization direction of the magnetic layer 3c to the magnetic layer 3a.

Further, since the volume of the T-shaped magnetization free layer 3 is much larger than the conventional magnetization free layer comprising only the ferromagnetic layer 3a, an excellent thermal stability can be achieved and a stable spin magnetic moment can be maintained even in a design rule of 0.1 μm or less. Thereby, practical use of a MRAM with 1 Gbit (Gigabit) or more can be made possible.

In this embodiment, since the ferromagnetic layer 3a and the intermediate layer 3b each have a low aspect ratio, a large capacity can be achieved.

Figure 2:
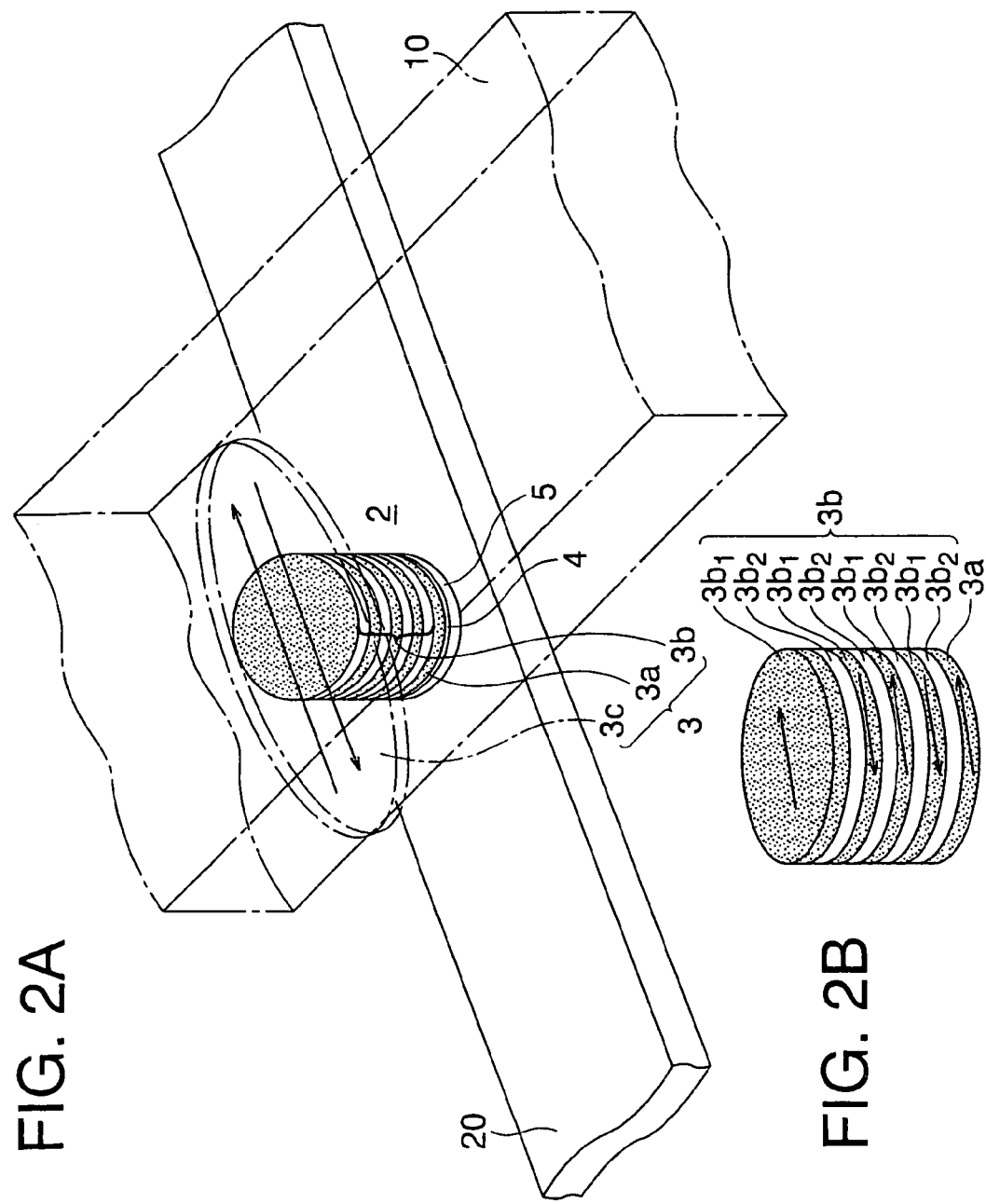
FIG. 2A is a perspective view showing a case where the magneto-resistance effect element according to the first embodiment has been used in a magnetic memory.
FIG. 2B is a perspective view showing an intermediate layer in the magneto-resistance effect element according to the first embodiment.

Incidentally, the intermediate layer 3b may be a single-layered magnetic layer, and it may be multi-layered film where a magnetic layer 3b1 and a non-magnetic layer 3b2 have been disposed alternately, as shown in FIGS. 2A and 2B. In case of the multi-layered film where magnetic layers and non-magnetic layers have been disposed alternately, it is preferable that anti-ferromagnetic exchange coupling or ferromagnetic exchange coupling between adjacent magnetic layers via a non-magnetic layer exists. Incidentally, in FIG. 2B, the intermediate layer 3b shows an anti-ferromagnetic exchange coupling. A ferromagnetic tunneling junction type magneto-resistance effect element 2 provided with the magnetization free layer 3 comprising the intermediate layer 3b with such a structure, the ferromagnetic layer 3a and the magnetic layer 3c, the tunnel barrier layer 4 and the magnetization fixed layer 5 is generally provided at each crossing point between an upper wiring (writing wiring) 10 and a lower wiring 20, as shown in FIG. 2A.

Figure 36:
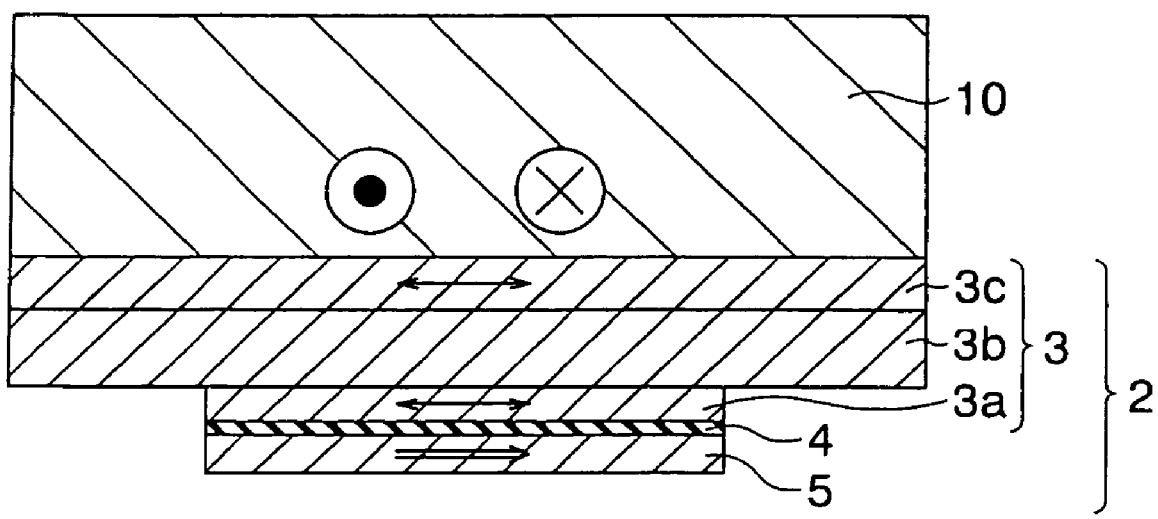
FIG. 36 is a sectional view showing a structure of a modification of the magneto-resistance effect element according to the first embodiment.

Further, the intermediate layer 3b may be a non-magnetic metal layer and it may have the same size as the magnetic layer 3c, as shown in FIG. 36. Even in this case, an anti-ferromagnetic exchange coupling or a ferromagnetic exchange coupling exits in the ferromagnetic layer 3a and the magnetic layer 3.

Figure 3:
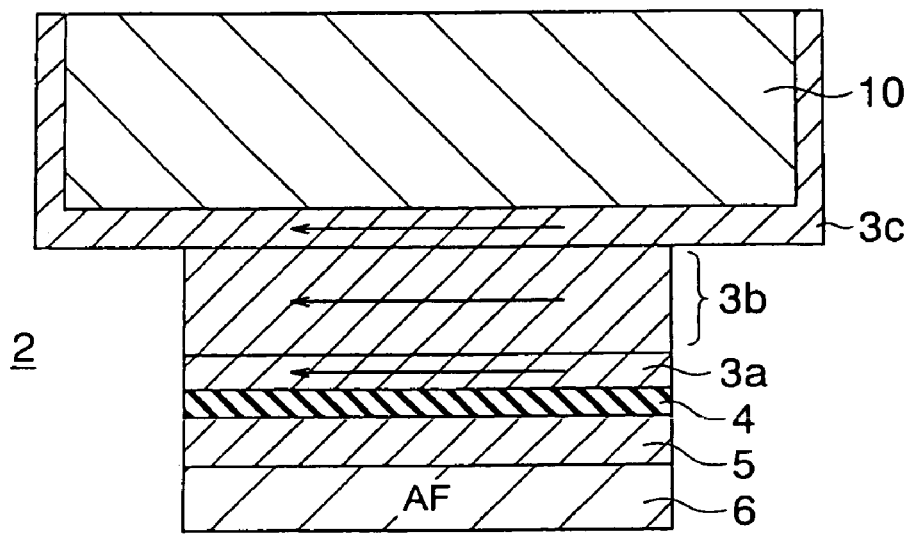
FIG. 3 is a sectional view showing a structure of a first modification according to the first embodiment of the magneto-resistance effect element.

Next, first to eighth modifications of the magneto-resistance effect element according to the first embodiment will be explained with reference to FIGS. 3 to 10. FIG. 3 shows a structure of a magneto-resistance effect element according to the first modification. A magneto-resistance effect element 2 according to the first modification has a structure that the magnetic layer 3c provided adjacent to the writing wiring 10 also extends on a side portion of the writing wiring 10 in the ferromagnetic tunneling junction element. Incidentally, in the first modification, an anti-ferromagnetic layer 6 which fixes magnetization direction of a magnetization fixed layer 5 comprising ferromagnetic material is provided on a face of the magnetization fixed layer 5 which is positioned on the opposite side of the tunnel barrier layer 4. However, in the first embodiment shown in FIG. 1, an anti-ferromagnetic layer 6 is provided and it is omitted. Though magnetization direction of the magnetization fixed layer 5 can be fixed by another method, it is unnecessary to provide an anti-ferromagnetic layer 6, but it is preferable that magnetization direction of the magnetization fixed layer 5 is fixed by the anti-ferromagnetic layer 6. Incidentally, in each of modifications of the first embodiment described below, an anti-ferromagnetic layer 6 is also provided. In the magneto-resistance effect element according to the first modification, since the volume of the magnetization free layer 3 is increased as compared with that in the first embodiment, a thermal stability in the modification is improved.

Figure 4:
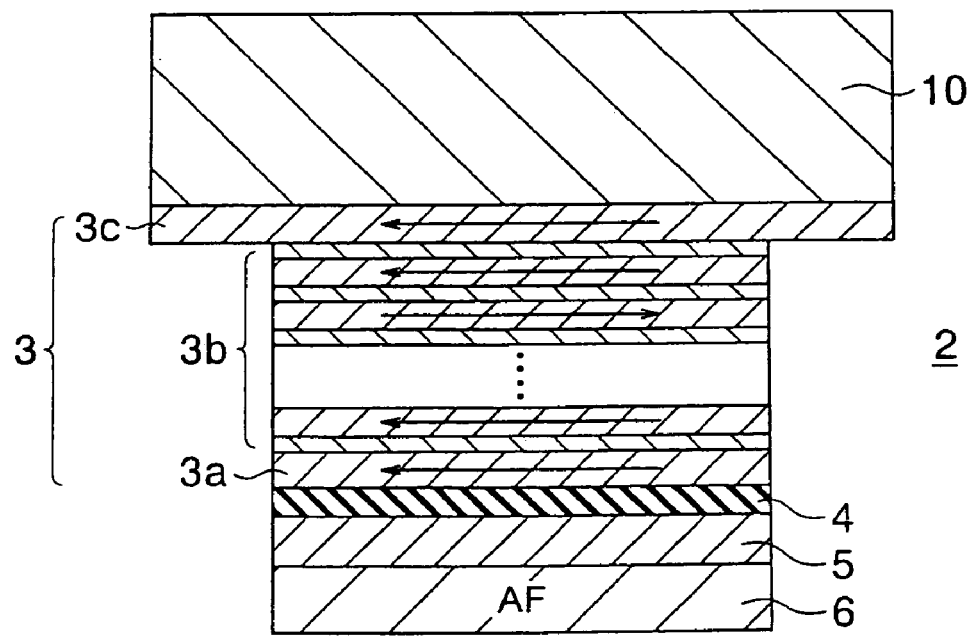
FIG. 4 is a sectional view showing a structure of a second modification according to the first embodiment of the magneto-resistance effect element.

FIG. 4 shows a structure of a magneto-resistance effect element according to the second modification. A magneto-resistance effect element 2 of the second modification has a structure that an intermediate layer 3b is formed in a multi-layer film where magnetic layers and non-magnetic layers have been stacked alternatively in the ferromagnetic tunnel junction element shown in FIG. 1.

In the multi-layered film, an anti-ferromagnetic exchange coupling or a ferromagnetic exchange coupling exists between adjacent magnetic layers via a non-magnetic layer.

Incidentally, a non-magnetic layer may exist between the magnetic layer 3c adjacent to the writing wiring and a magnetic layer closest to the magnetic layer 3c of the magnetic layers constituting the intermediate layer 3b, and the magnetic layer 3c and the magnetic layer closest to the magnetic layer 3c may come in direct contact with each other. Further, a non-magnetic layer may exist between the ferromagnetic layer 3a serving as a storage layer and a magnetic layer closest to the ferromagnetic layer 3a of the magnetic layers constituting the intermediate layer 3b, and the ferromagnetic layer 3a and the magnetic layer closest to the ferromagnetic layer 3a may come in direct contact with each other.

In the magneto-resistance effect element 2 according to the second modification, since the magnetization free layer 3 is increased in volume as compared with that in the first embodiment, an increased thermal stability can be achieved. Further, since the intermediate layer 3b has the multi-layered film structure where magnetic layers and non-magnetic layers have been stacked alternatively, it is made possible to prevent multi-stage hysteresis from occurring, an MR change ratio (MR ratio) can be made high and a high output can be achieved.

Figure 5:
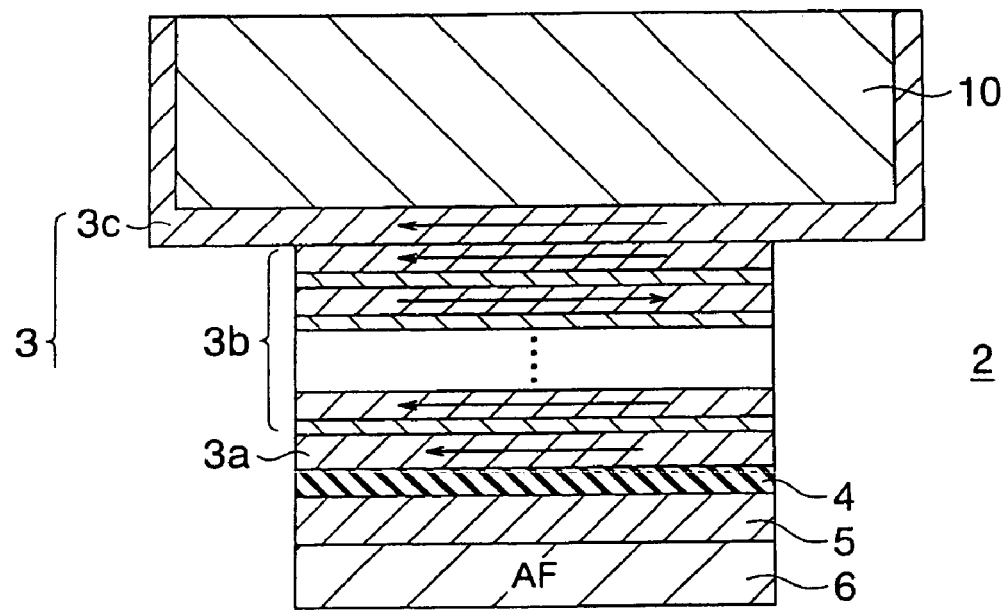
FIG. 5 is a sectional view showing a structure of a third modification according to the first embodiment of the magneto-resistance effect element.

FIG. 5 shows a structure of a magneto-resistance effect element according to a third modification. A magneto-resistance effect element 2 according to the third modification has a structure that a magnetic layer 3c also extends on a side portion of the writing wiring 10 in the second modification shown in FIG. 4. In the magneto-resistance effect element according to the third modification, since the volume of the magnetization free layer 3 is increased as compared with that in the second modification, a thermal stability in third modification is improved. Further, since the intermediate layer 3b has the multi-layered film structure that the magnetic layer and the non-magnetic layer have been stacked alternatively, a MR change ratio becomes high and a high output can be achieved.

Figure 6:
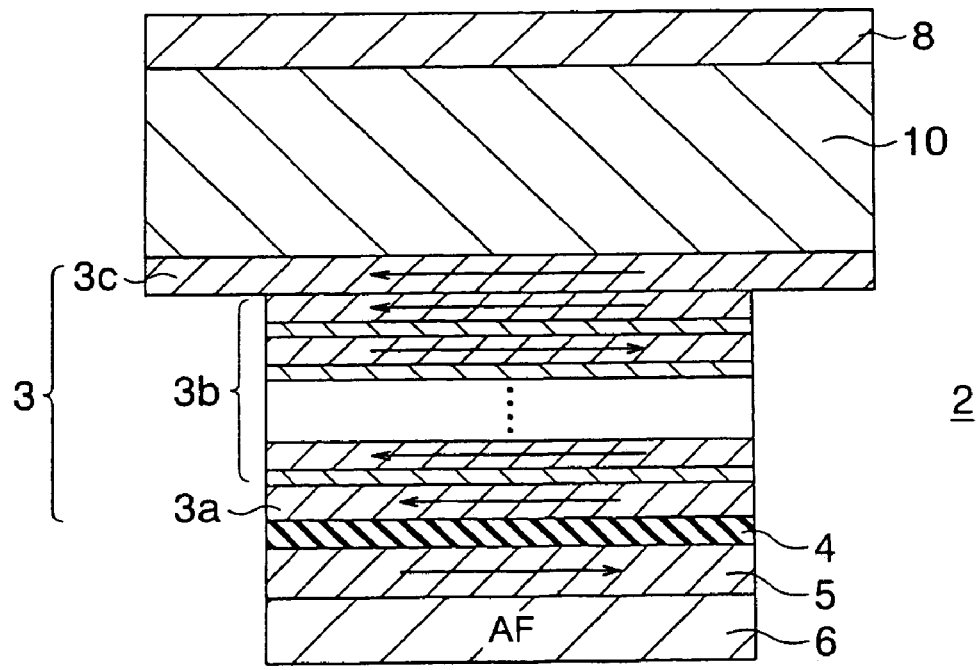
FIG. 6 is a sectional view showing a structure of a fourth modification according to the first embodiment of the magneto-resistance effect element.

FIG. 6 shows a structure of a magneto-resistance effect element according to a fourth modification. A magneto-resistance effect element 2 according to the fourth modification has a structure that a magnetic substance covering film (yoke) 8 is provided on the opposite side of the writing wire 10 from the magnetic layer 3c in the third modification shown in FIG. 5. When the yoke 8 is further provided on the writing wiring 10, it is made possible to further reduce a writing current, and a spin inversion (an inversion of a magnetization direction) can be made possible by a writing current with 0.2 mA or less. Incidentally, when no current flows in the writing wiring 10, there does not occur a magnetic interaction between the yoke 8 and the magnetization free layer 3 of the magneto-resistance effect element 2. Since the volume of the magnetic free layer 3 is larger than that of the conventional one, a thermal stability is increased. Further, since the intermediate layer 3b has the multi-layered film structure where the magnetic layer and the non-magnetic layer have been stacked alternatively, a MR ratio can be made high and a high output can be achieved.

Figure 7:
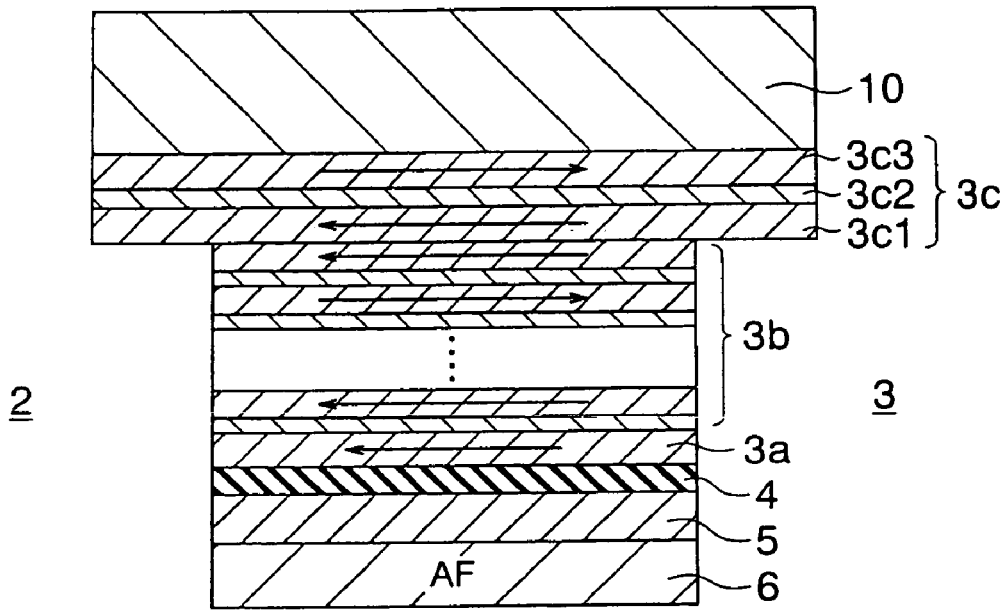
FIG. 7 is a sectional view showing a structure of a fifth modification according to the first embodiment of the magneto-resistance effect element.

FIG. 7 shows a structure of a magneto-resistance effect element according to a fifth modification. A magneto-resistance effect element 2 according to the fifth modification has a structure that a magnetic layer 3c adjacent to the writing wiring 10 has a stacked structure comprising a magnetic layer 3c1, a non-magnetic layer 3c2 and a magnetic layer 3c3 in the second modification shown in FIG. 4. When the multi-layered film of the stacked structure is employed in the magnetic layer 3c in this manner, the volume of the magnetization free layer 3 becomes larger than that of the second modification, so that further improvement of a thermal stability can be achieved. Furthermore, since the intermediate layer 3b has the multi-layered film structure where the magnetic layer and the non-magnetic layer have been stacked alternatively, a MR ratio can be made high and a high output can be achieved.

Figure 8:
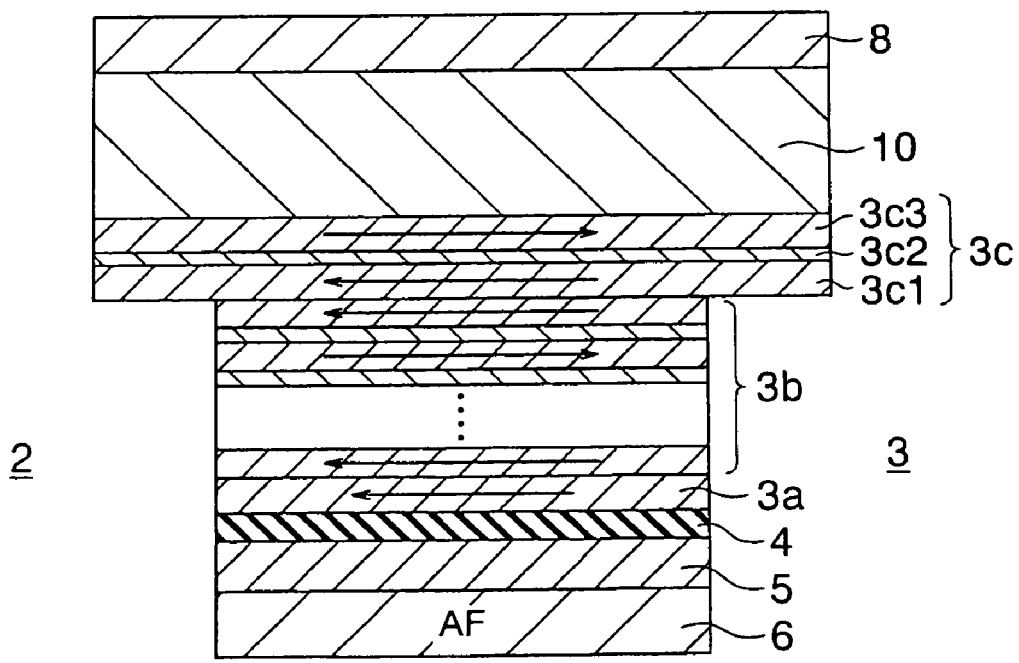
FIG. 8 is a sectional view showing a structure of a sixth modification according to the first embodiment of the magneto-resistance effect element.

FIG. 8 shows a structure of a magneto-resistance effect element according to a sixth modification. A magneto-resistance effect element 2 according to the sixth modification has a structure that a yoke 8 is further provided on the opposite side of the writing wiring 10 from the magnetic layer 3c in the fifth modification shown in FIG. 7. This sixth modification can achieve a further thermal stability like the fifth modification. Further, since the yoke 8 is provided in this modification, a writing current can be further reduced and a spin inversion can be conducted with a writing current of 0.2 mA or less. Incidentally, when no current flows in the writing wiring 10, there is not a magnetic interaction between the yoke 8 and the magnetization free layer 3 of the magneto-resistance effect element 2. In addition, since the intermediate layer 3b has the multi-layered film structure that the magnetic layer and the non-magnetic layer have been stacked alternatively, a MR ratio becomes high and a high output can be achieved.

Figure 9:
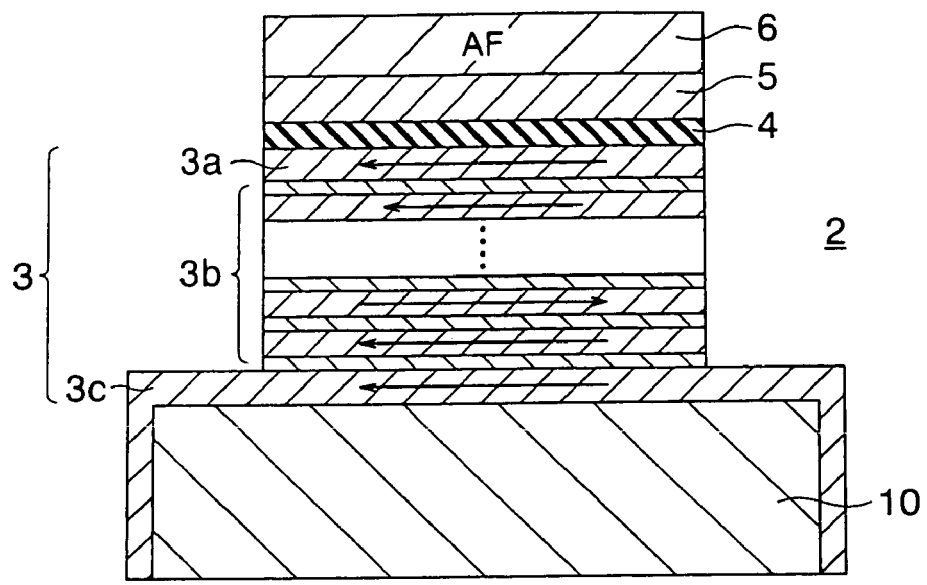
FIG. 9 is a sectional view showing a structure of a seventh modification according to the first embodiment of the magneto-resistance effect element.

FIG. 9 shows a structure of a magneto-resistance effect element according to a seventh modification. A magneto-resistance effect element 2 according to the seventh modification has the same structure as the magneto-resistance effect element 2 according to the third modification shown in FIG. 5, and the seventh modification has a structure that the magneto-resistance effect element 2 has been provided on the writing wiring 10. The seventh modification can achieve improvement in thermal stability like the third modification. Further, since the intermediate layer 3b has the multi-layered film structure that the magnetic layer and the non-magnetic layer have been stacked alternatively, a MR ratio becomes high and a high output can be achieved.

Figure 10:
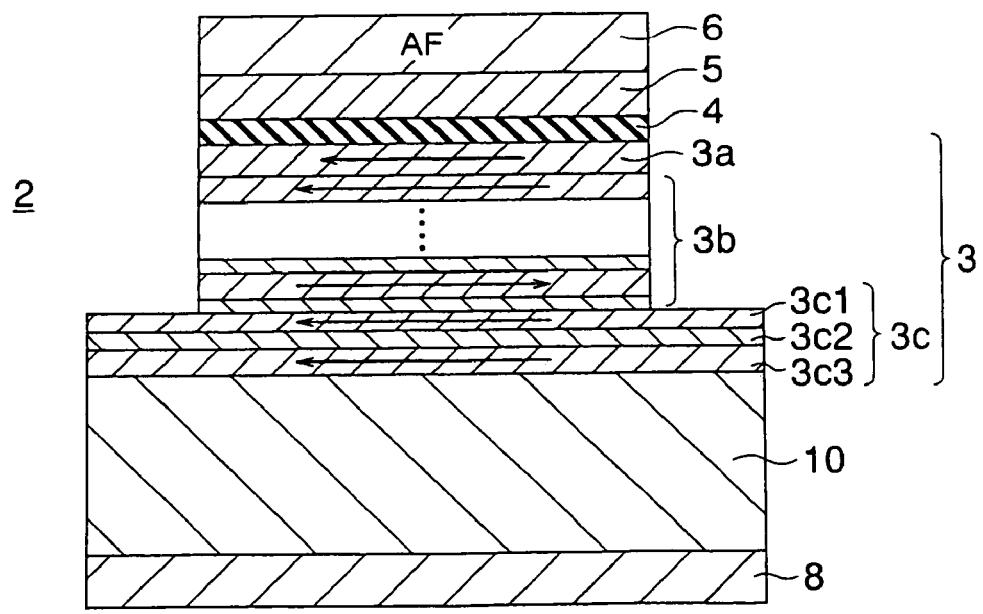
FIG. 10 is a sectional view showing a structure of an eighth modification according to the first embodiment of the magneto-resistance effect element.

FIG. 10 shows a structure of a magneto-resistance effect element according to an eighth modification. A magneto-resistance effect element 2 according to the eighth modification has the same structure as the magneto-resistance effect element of the sixth modification shown in FIG. 8, and the eighth modification has a structure that the magneto-resistance effect element 2 has been provided on the writing wiring 10. The eighth modification can achieve improvement in thermal stability like the sixth modification. Further, since the intermediate layer 3b has the multi-layered film structure that the magnetic layer and the non-magnetic layer have been stacked alternatively, a MR ratio becomes high and a high output can be achieved. In addition, since the yoke 8 is provided in this modification, a writing current can be further reduced and a magnetization direction can be inverted with a writing current of 0.2 mA or less. Incidentally, when no current flows in the writing wiring 10, there is not a magnetic interaction between the yoke 8 and the magnetization free layer 3 of the magneto-resistance effect element 2.

Figure 13:
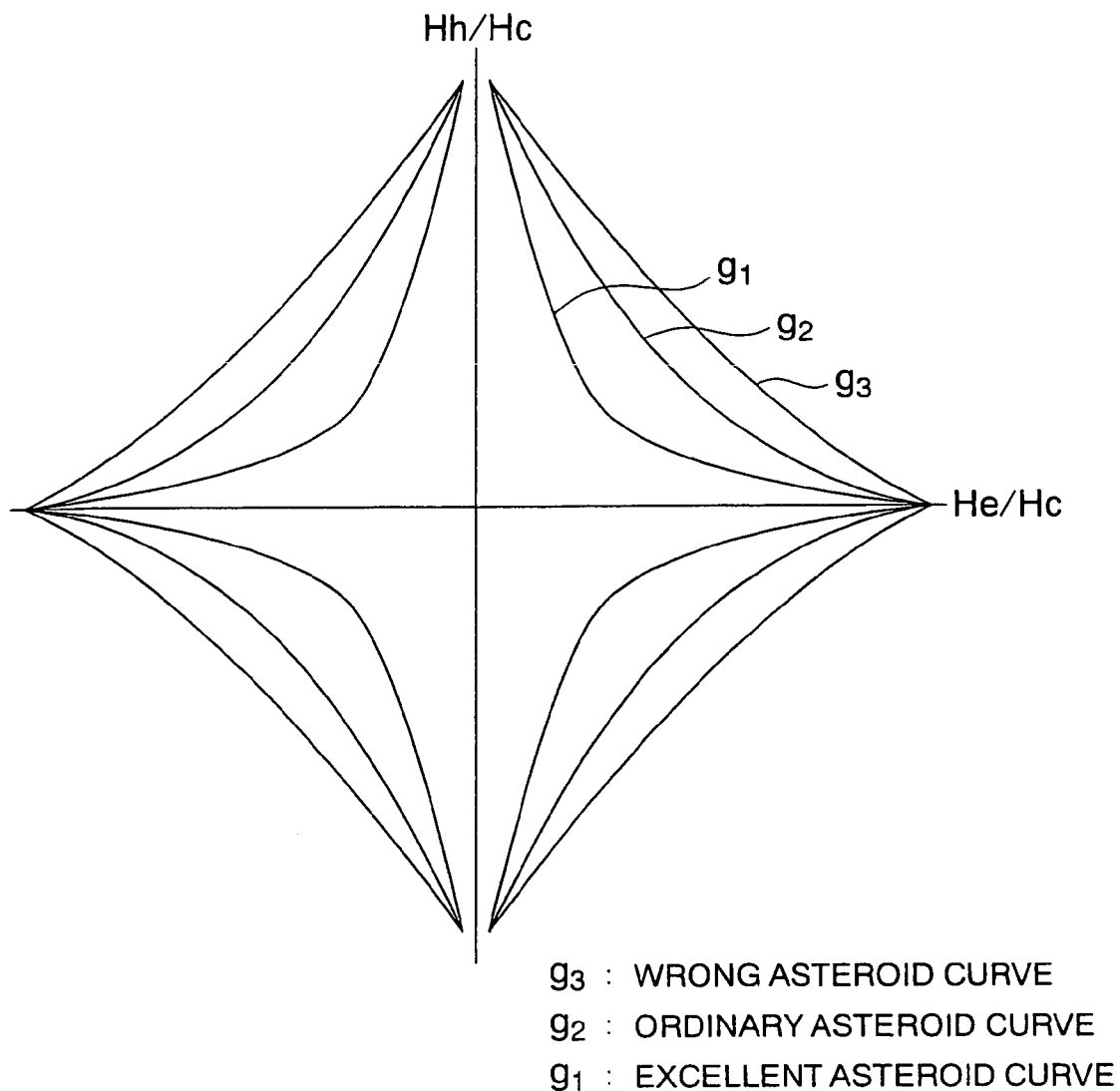
FIG. 13 is a diagram showing asteroid curves.

Next, the plane figure of the magnetic layer 3c which is included in the magnetization free layer 3 constituting the magneto-resistance effect element according to the first embodiment and is provided adjacent to the writing wiring 10 will be explained with reference to FIGS. 11A to 11F. Various plane shapes of the magnetic layer 3c are shown in FIGS. 11A to 11F. FIG. 11A shows an oval shape, FIG. 11B shows a Rugby ball shape, FIG. 11C shows a shape obtained by cutting corners from a rectangular shape, FIG. 11D shows a rectangular shape, FIG. 11E shows an octagonal shape, and FIG. 11F shows a cross shape. It is preferable that each of plane figures of the magnetic layers 3c has an aspect ratio (=longitudinal axis/short axis) of 1 or more except for plane figures of the octagonal shape shown in FIG. 11E and the cross shape shown in FIG. 11F. That is, the magnetic layer is formed such that the length L1 thereof in a direction substantially perpendicular to a current direction in which a current flows in the writing wiring 10 is longer than the current direction. Incidentally, the current direction corresponds to the short axis and a direction substantially perpendicular to the current direction corresponds to the longitudinal axis. As described later, when current pulses are applied to two wirings substantially perpendicular to each other to conduct a spin inversion, a stable magnetic anisotropy can be achieved by employing these curves, and curves of asteroids are improved. In case of the aspect ratio of 1:1, when the plane figure of the magnetic layer 3c is formed in an octagonal shape or a cross shape, the curve of the asteroid becomes good. Moreover, the form of an asteroid will become good when the direction of the magnetization easy axis is leaned 30 degrees to 60 degrees to the direction of a longitudinal axis of the wiring. The fact that a curve of asteroid is good means that an asteroid is positioned so as to be closer to coordinate axes than other asteroid curves g2 and g3, as an asteroid g1 shown in FIG. 13, so that a value of a switching magnetic field at a time of spin inversion is small while a value of the switching magnetic field is large except for the time of spin inversion. By attaining such an asteroid curve, cell selection is made easy.

FIGS. 12(a) to 12H show plane figures of the intermediate layer 3b. FIGS. 12(a) to 12(d) show plane figures of the intermediate layer 3b having a ratio of the length W in a current direction in which a current flows in the writing wiring 10 and the length L in a direction perpendicular to the current direction of 1:1, and FIGS. 12(e) to 12(h) show plane figures thereof having cases that L is longer than W. Incidentally, such a structure is employed that L becomes shorter than the length L1 of the magnetic layer 3c in a longitudinal axis.

In each of the above cases, such a structure is employed that an area of a film face of the magnetic layer 3c provided adjacent to the writing wiring 10 is larger than the areas of the film faces of the intermediate layer 3b and the ferromagnetic layer 3a constituting the tunnel junction type magneto-resistance effect element.

Further, it is preferable that the aspect ratio of the film face of the magnetization free layer is 1 or more but 2 or less even in either section parallel with the film face.

In these magneto-resistance effect elements 2, as ferromagnetic material which can be used in the magnetization fixed layer 5, the magnetic layer 3a serving as the storage layer and the intermediate layer 3b, for example, Fe (iron), Co (cobalt), Ni (nickel) or alloy thereof, oxides having a large polarizability in spin, such as magnetite, $CrO_2$, $RXMnO_{3-y}$ (here, R represents rare earth metal, and X represents one of Ca (calcium), Ba (barium), Sr (strontium)), or Heusler's alloy such as NiMnSb (nickel-manganese-niobium), PtMnSb (platinum manganese-antimony) or the like can be used.

It is preferable that the magnetization fixed layer comprising these materials has a unidirectional anisotropy (shape anisotropy), and the magnetic layer 3a and the intermediate layer 3b each have a uniaxial anisotropy. It is preferable that these layers have a thickness in the range of 0.1 nm to 100 nm.

Further, each of the ferromagnetic layer 5, 3a and 3b must have a film thickness in which it is not changed to superparamagnetism, and it is therefore preferable that the film thickness is 0.4 nm or more.

Further, it is preferable that magnetization of a ferromagnetic layer used as the magnetization fixed layer 5 is fixed by adding an anti-ferromagnetic film to the layer. Such an anti-ferromagnetic film can comprise Fe (iron)-Mn (manganese), Pt (platinum-Mn (magnanese), Pt (platinum)-Cr (chromium)-Mn (manganese), Ni (nickel)-Mn (manganese), Ir (iridium)-Mn (manganese), NiO (nickel oxide), $Fe_2O_3$ (iron oxide) or the like.

Furthermore, the magnetic characteristic of magnetic material used may be adjusted by adding thereto non-magnetic element such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), w (tungsten), Mo (molybdenum), Nb (niobium) or the like. Besides, various physical properties such as crystallization, mechanical properties, chemical properties or the like can be adjusted.

On the other hand, a stacked layer film comprising a ferromagnetic layer and a non-magnetic layer may be used as the magnetization fixed layer 5, the magnetic layer 3a or the intermediate layer 3b. For example, a film having a three-layered structure including a ferromagnetic layer/a non-magnetic layer/a ferromagnetic layer or a multi-layered film with three or more layers may be used. In this case, it is preferable that an anti-ferromagnetic interaction acts to the ferromagnetic layers sandwiching the non-magnetic layer.

More specifically, as means for fixing magnetization of a magnetic layer in one direction, a stacked film having a three-layered structure comprising Co or Co—Fe/Ru (ruthenium)/Co or Co—Fe, a stacked film having a three-layered structure comprising Co (Co—Fe)/Ir (iridium)/Co (Co—Fe), a stacked film having a three-layered structure comprising Co or Co—Fe/Os (osmium)/Co or Co—Fe, a stacked film having a three-layered structure comprising Co or Co—Fe/Re (rhenium)/Co or Co—Fe, a stacked film having a three-layered structure comprising an amorphous material layer such as Co—Fe—B/Ru (ruthenium)/an amorphous material layer such as Co—Fe—B, a stacked film having a three-layered structure comprising an amorphous material layer such as Co—Fe—B/Ir (iridium)/an amorphous material layer such as Co—Fe—B, a stacked film having a three-layered structure comprising an amorphous material layer such as Co—Fe—B/Os (osmium)/an amorphous material layer such as Co—Fe—B, or a stacked film having a three-layered structure comprising an amorphous material layer such as Co—Fe—B/Re (rhenium)/an amorphous material layer such as Co—Fe—B is used. In case that such a stacked film is used as the magnetization fixed layer, it is preferable that an anti-ferromagnetic film is provided adjacent to the stacked film. In this case, also, as a material for the anti-ferromagnetic film, Fe—Mn, Pt—Mn, Pt—Cr—Mn, Ni—Mn, Ir—Mn, NiO, $Fe_2O_3$ or the like can be used in the same manner as described above. With this structure, magnetization of the magnetization fixed layer 5 is hardly influenced by a current magnetic field from a bit line or a word line, so that the magnetization direction is firmly fixed. Further, stray field from the magnetization fixed layer 5 can be reduced (or adjusted), and magnetization shifting of the magnetic recording layer 3a can be adjusted by changing the film thicknesses of the two ferromagnetic layers forming the magnetization fixed layer 5. It is necessary to set the film thickness of each ferromagnetic layer to such a film thickness where it is not changed to superparamagnetism, and it is more preferable that the film thickness is in the range of 0.4 nm or more.

In addition, as the magnetic recording layer 3c, a two-layered structure such as a soft magnetic layer/a ferromagnetic layer, or a three-layered structure such as a ferromagnetic layer/a soft magnetic layer/a ferromagnetic layer may be used. Such a preferable effect that, even if a cell width of a magnetic recording layer which is a memory cell becomes submicron or less, it is unnecessary to increase power consumption of a current magnetic field, can be obtained by using a three-layered structure such as a ferromagnetic layer/a non-magnetic layer/a ferromagnetic layer or a five-layered structure such as a ferromagnetic layer/a non-magnetic layer/a ferromagnetic layer/a non-magnetic layer/a ferromagnetic layer as the magnetic recording layer 3c to control the strength of interaction of interlayer of the ferromagnetic layer. In this case, the kind and the film thickness of the ferromagnetic layer may be changed.

In particular, it is more preferable that, when Co—Fe, Co—Fe—Ni or Fe rich Ni—Fe which increases a MR ratio is used in the ferromagnetic layer close to the tunnel barrier film 4 and Ni rich Ni—Fe, Ni rich Ni—Fe—Co or the like is used in the ferromagnetic substance which does not come in contact with the tunnel barrier film 4, a switching magnetic field can be reduced while the MR rate is kept large. As the non-magnetic material, Ag (silver), Cu (copper), Au (gold), Al (aluminum), Ru (ruthenium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium) or alloy thereof can be used.

The magnetic characteristic of the magnetic recording layer 3a can be adjusted by adding such non-magnetic element as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), C (carbon), O (oxygen), N (nitrogen), Pd (palladium), Pt (platinum), Zr (zirconium), Ir (iridium), w (tungsten), Mo (molybdenum), Nb (niobium) or the like to the magnetic material. Besides, various physical properties such as crystallization, mechanical properties, chemical properties or the like can be adjusted.

On the other hand, when the TMR element is used as the magneto-resistance effect element, various insulators (dielectrics) such as $Al_2O_3$ (aluminum oxide), $SiO_2$ (silicon oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium oxide/strontium), $AlLaO_3$ (lanthnum oxide/aluminum), Al—N—O (aluminum oxide-aluminum nitride) or the like can be used as the insulating layer (or the dielectric layer) serving as the tunnel barrier layer 4 provided between the magnetization fixed layer 5 and the magnetic recording layer 3a.

These insulators are not required to have completely accurate composition in view of stoichiometry, and they may include excess or deficiency of oxygen, nitrogen, fluoride or the like. Further, it is preferable that the thickness of the insulating layer (dielectric layer) 4 is as thin as a tunnel current flows. It is preferable that the thickness is actually 10 nm or less.

Such a magneto-resistance effect element can be formed on a predetermined substrate by using such an ordinary thin film forming process such as various sputtering processes, vapor depositing processes, molecular beam epitaxy or the like. In this case, as the substrate, a substrate comprising Si (silicon), $SiO_2$ (silicon oxide), $Al_2O_3$ (aluminum oxide), spinel, AlN (aluminum nitride) or the like can be used.

Further, a layer comprising Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum)-Cu (copper), Ru (ruthenium), Ir (iridium) or Os (osmium) may be provided on the substrate as a underground layer or a protective layer for the hard mask or the like.

Second Embodiment

Figure 14B:
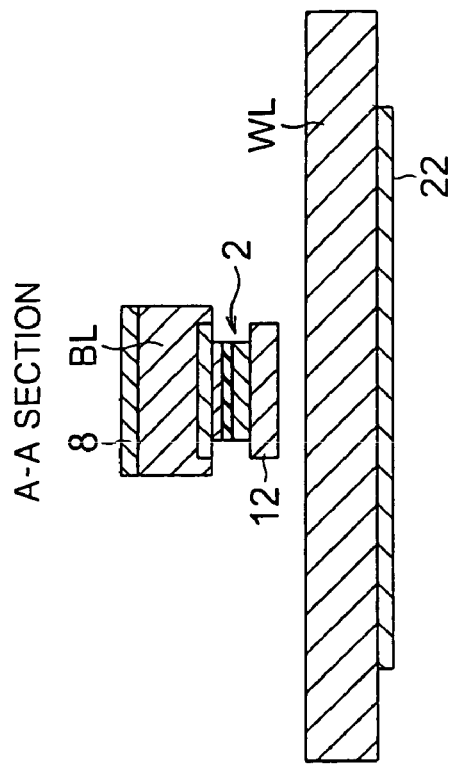
FIGS. 14A and 14B are views showing a structure of a magnetic memory according to a second embodiment of the present invention.
Figure 14A:
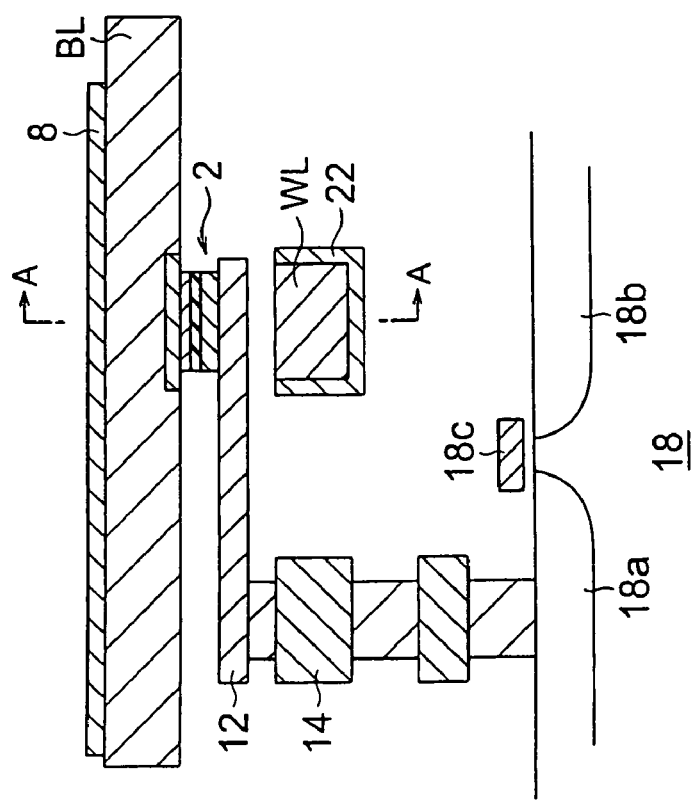

Next, a magnetic memory according to a second embodiment of the present invention will be explained with reference to FIGS. 14A and 14B. FIG. 14A is a view showing a structure of a unit memory cell in a magnetic memory according to this embodiment, and FIG. 14B is a sectional view of the unit memory cell taken along line A-A shown in FIG. 14A. A magnetic memory according to this embodiment is provided with a plurality of bit lines BL (one bit line BL shown in FIGS. 14A and 14B), a plurality of word lines WL (one word line WL shown in FIGS. 14A and 14B) crossing these bit lines BL and a plurality of memory cell (one memory cell (unit cell) shown in FIGS. 14A and 14B) provided at respective crossing points of the bit lines BL and the word lines WL. That is, the memory cells are arranged in a matrix shape to form a memory array. Each memory cell is provided with a storage element 2 comprising a magneto-resistance effect element and provided at a crossing point of a bit line BL and a word line WL and a reading cell selecting transistor 18. The reading cell selecting transistor 18 comprises a source/drain regions 18a/18b and a gate electrode 18c.

The storage element 2 used in this embodiment is the TMR element explained in each of the first embodiment or its modified embodiments. That is, a T-shaped magnetization free layer constituting one end portion of the TMR element 2 is provided adjacent to a bit line BL serving as a writing wiring. Also, a yoke 8 is provided on the opposite side of the bit line BL from the T-shaped magnetization free layer. An opposite end portion of the TMR element 2 from the T-shaped magnetization free layer is connected to one region 18a of the source/drain regions of the reading cell selecting transistor 18 via a leading electrode 12 and a connection plug 14.

The word line WL is disposed below the leading electrode 12 via an insulating film (not shown), and it is covered with a yoke 22.

Writing of data into the TMR element 2 constituting a memory cell is conducted by a magnetic field obtained by causing writing currents to flow into a corresponding bit line BL and a corresponding word line WL to form current magnetic fields and compose them. Reading of data from the TMR element 2 constituting the memory cell is conducted by turning ON the reading cell selecting transistor 18 of the memory cell to cause a sense current to flow in the bit line BL via the TMR element 2.

Since the magnetic memory according to the second embodiment uses one TMR element of the first embodiment and its modifications as the storage element, a writing current can be reduced and an excellent thermal stability can be achieved. Further, when the intermediate layer constituting the TMR element is constituted as a multi-layered film where a magnetic layer and a non-magnetic layer have been stacked alternatively, a MR ratio can be made high and a high output can be achieved.

Third Embodiment

Figure 15B:
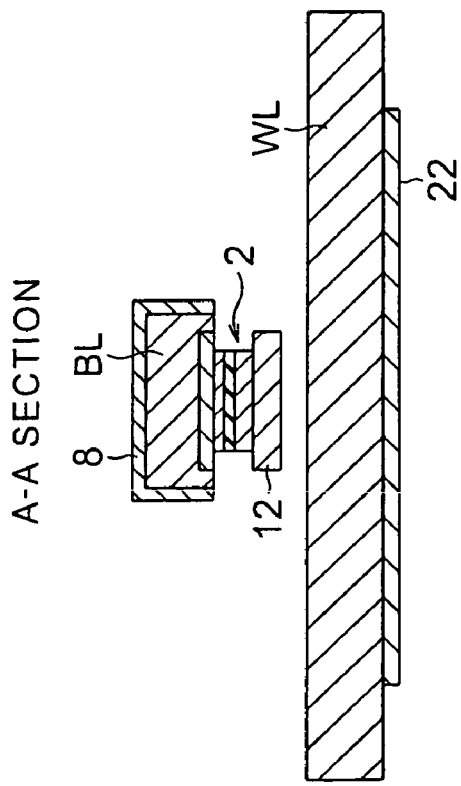
FIGS. 15A and 15B are views showing a structure of a magnetic memory according to a third embodiment of the present invention.
Figure 15A:
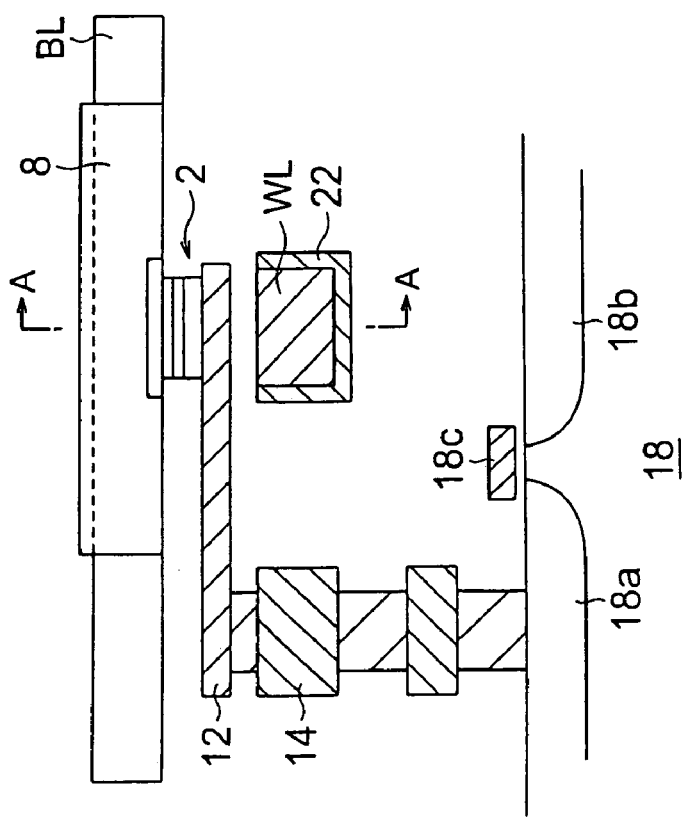

Next, a magnetic memory according to a third embodiment of the present invention will be explained with reference to FIGS. 15A and 15B. FIG. 15A is a view showing a structure of a unit memory cell of a magnetic memory according to this embodiment and FIG. 15B is a sectional view of the unit memory cell taken along line A-A shown in FIG. 15A. A magnetic memory according to this embodiment is constituted such that the yoke 8 provided on the bit line BL also extends on side portions of the bit line BL shown in FIGS. 14A and 14B in the magnetic memory according to the second embodiment shown in FIGS. 14A and 14B. Thereby, a writing current can be further reduced as compared with that in the second embodiment. Incidentally, the T-shaped magnetization free layer of the TMR element 2 and the yoke are not connected to each other, and a magnetic interaction therebetween does not occur while no current flows in the bit line BL.

The magnetic memory according to this embodiment of the present invention can attain an excellent thermal stability like the case in the second embodiment.

Fourth Embodiment

Next, a magnetic memory according to a fourth embodiment will be explained with reference to FIGS. 16A and 16B. FIG. 16A is a sectional view showing a structure of a unit memory cell in a magnetic memory according to this embodiment, and FIG. 16B is a sectional view of the unit memory cell taken along line A-A shown in FIG. 16A. A magnetic memory according to this embodiment is constituted such that the T-shaped magnetization free layer constituting the TMR element 2 is provided adjacent to the word line WL instead of the bit line BL and an opposed end portion of the TMR element 2 from the T-shaped magnetization free layer is connected to the source region 18a of the reading cell selecting transistor 18 via the leading electrode 12 and the connection plug 14 in the magnetic memory in the second embodiment. A bit line BL is disposed above the leading electrode 12 via an insulating film (not shown). A yoke 8 is provided on the bit line BL so as to extend to side portions of the leading electrode 12.

By employing such a structure that the yoke 8 extends near to the TMR element 2 in this manner, a writing current can be further reduced and a low power consumption can be achieved. Further, an excellent thermal stability can be achieved like the second embodiment.

In the second to fourth embodiments, it is preferable in order to achieve a further massive bulk memory that a memory cell allay is multi-layered using an architecture which allows stacking of the memory cell array.

Fifth Embodiment

Next, a magnetic memory according to a fifth embodiment of the present invention will be explained with reference to FIGS. 17A, 17B and 17C. FIG. 17A is a sectional view showing a structure of a magnetic memory according to this embodiment, FIG. 17B is a view showing a structure of a unit memory cell of the magnetic memory according to this embodiment, and FIG. 17C is a sectional view of the unit memory cell taken along line A-A shown in FIG. 17B.

A magnetic memory according to this embodiment has a structure that TMR elements 2 are respectively connected to a reading/writing bit line BL in a parallel manner via diodes 9. Incidentally, the TMR element used in this embodiment is either one of the TMR elements of the first embodiment and its modifications. The other ends of the respective TMR elements 2 are connected with reading/writing word lines WL. Incidentally, the T-shaped magnetization free layer constituting the TMR element 2 is provided adjacent to the word line WL. An opposite side end of the TMR element 2 from the T-shaped magnetization free layer is connected to the bit line BL via the diode 9.

At a time of reading, a bit line BL and a word line WL connected to a target TMR element 9 are selected by respective selecting transistors STB and STw and a current flowing in the target TMR element 2 is detected by a sense amplifier SA. Further, at a time of writing, a bit line BL and a word line WL connected to a target TMR element 2 are selected by respective selecting transistors STB and STw and a writing current is caused to flow. At this time, a writing magnetic field obtained by composing magnetic fields respectively generated in the bit line BL and the word line WL turns magnetization of the magnetic recording layer of the TMR element 2 in a predetermined direction to perform writing.

The diode 9 serves to shut off by-pass currents flowing through the other TRM elements 2 arranged in a matrix manner at a time of reading or writing.

Incidentally, in FIG. 17B, only a bit line BL, a TMR element 2, a diode 9 and a word line WL are shown for simplification and the other elements are omitted. A shown in FIG. 17B, writing is conducted using the bit line BL and the word line WL orthogonal to each other. The bit line BL and the word line WL have yokes 8 and 22 formed thereon, respectively. Such a structure is employed that the yokes 8 and 22 extend in the vicinity of the TMR element 2. Since the yokes covering the bit line BL and the word line WL can be caused to approach to the T-shaped magnetization free layer of the TMR element, writing can be conducted with low power consumption and with a low current. Further, since the TMR element having the T-shaped magnetization free layer is used, an excellent thermal stability can be achieved.

Incidentally, in order to realize a further massive bulk memory, it is desirable that a memory array is multi-layered using an architecture which allows multi-layer of the memory array.

Sixth Embodiment

Figure 18A:
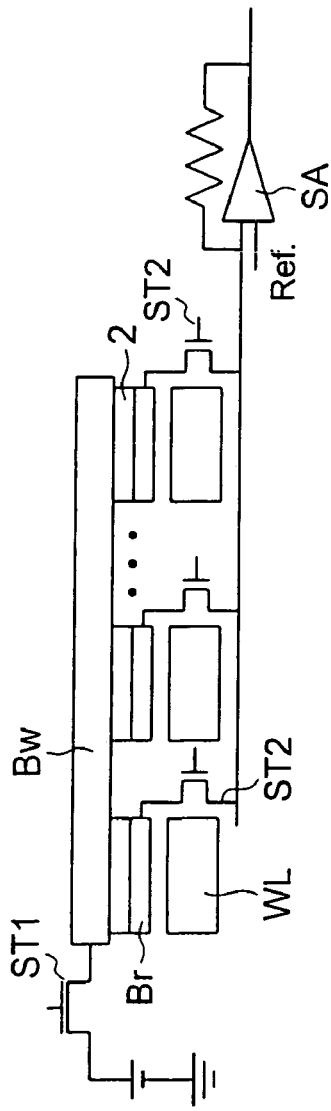
FIGS. 18A to 18C are views showing a structure of a magnetic memory according to a sixth embodiment of the present invention.
Figure 18C:
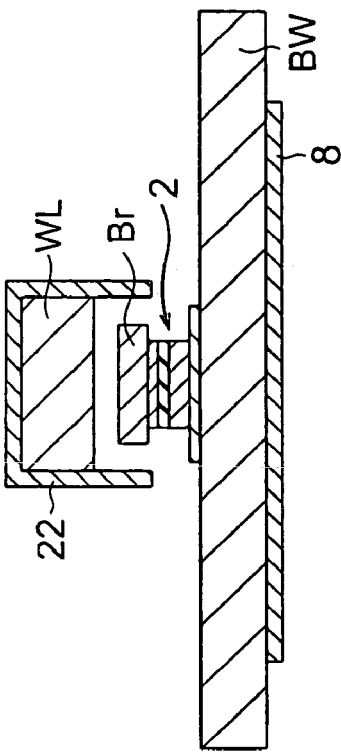
Figure 18B:
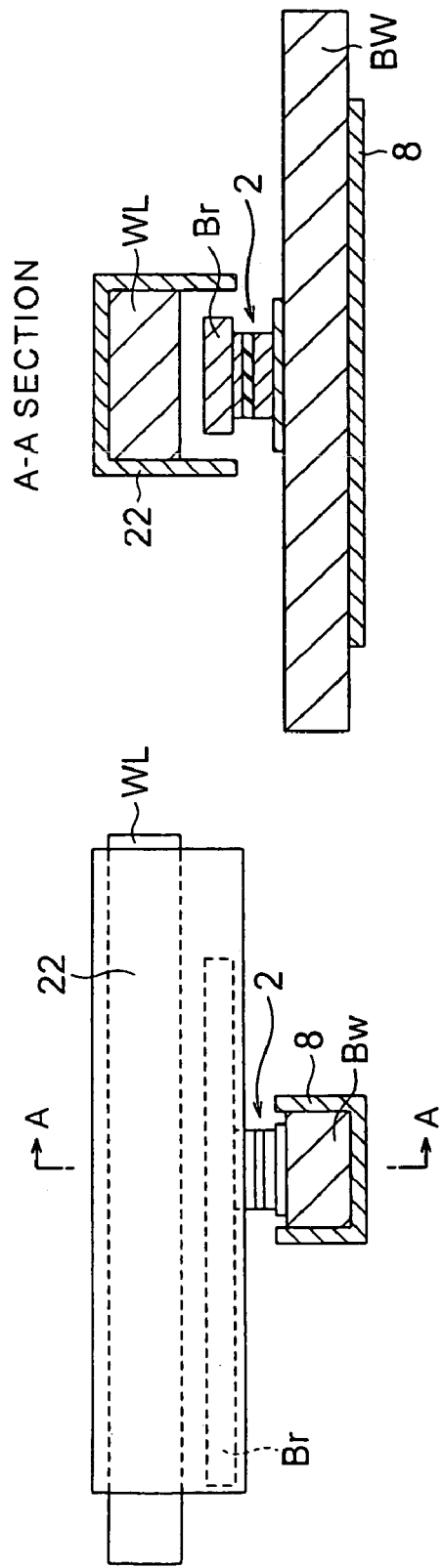

Next, a magnetic memory according to a sixth embodiment of the present invention will be explained with reference to FIGS. 18A, 18B and 18C. FIG. 18A is a sectional view showing a structure of a magnetic memory according to this embodiment, FIG. 18B is a view showing a structure of a unit memory cell of the magnetic memory according to this embodiment, and FIG. 18C is a sectional view of the unit memory cell taken along line A-A shown in FIG. 18B.

A magnetic memory according to this embodiment has a "ladder type" structure where a plurality of TMR elements 2 are connected in parallel between a reading/writing bit line Bw and a reading bit line Br. Further, the writing word lines W is wired in the vicinity of each TMR element 2 in a direction orthogonal to the bit line Bw.

Writing in the TMR element 2 can be performed by causing a composite magnetic field comprising a magnetic field generated by causing a writing current to flow in the writing bit line Bw and a magnetic field generated by causing a writing current to flow in the writing word line WL to act on the magnetic recording layer of the TMR element 2.

On the other hand, when reading is conducted, a voltage is applied between the bit line Bw and the bit line Br. Thereby, currents are caused to flow in all the TMR elements 2 connected in parallel between the bit lines Bw and Br. While the sum of the currents being detected by the sense amplifier SA, a writing current is applied to the word line WL close to the target TMR element 2, so that the magnetization of the magnetic recording layer of the target TMR element 2 is rewritten in a predetermined direction. By detecting a current change occurring at this time, reading of the target TMR element 2 can be conducted.

That is, when the magnetization direction of the magnetic recording layer before re-writing is the same as that of the magnetic recording layer after re-writing, a current detected by the sense amplifier SA does not vary. However, when the magnetization direction of the magnetic recording layer is inverted before and after re-writing, a current detected by the sense amplifier SA varies due to a magneto-resistance effect. Thus, the magnetization direction of the magnetic recording layer before rewriting, namely, stored data can be read out in this manner.

Incidentally, this method corresponds to a case that stored data is changed at a time of reading, so-called "destructive reading".

On the other hand, when a structure such as a magnetization free layer/an insulating layer (non-magnetic layer)/a magnetic recording layer is employed as the structure of the magneto-resistance effect element, a so-called "non-destructive reading" will be made possible. That is, in case that a magneto-resistance effect element having this structure is used, the magnetization direction is recorded in the magnetic recording layer, and the magnetization direction of the magnetic recording layer can be read out at a time of reading-out by changing the magnetization direction of the magnetization free layer properly to compare sense currents before and after the change with each other. Incidentally, it is necessary to make design such that a magnetization (flux) inverting magnetic field of the magnetization free layer is smaller that that of the magnetic recording layer.

Incidentally, in FIG. 18B, only the bit lines Br and Bw, the TWR element 2 and the word line WL are shown for simplification, and the other elements have been omitted. As shown in FIG. 18B, writing is conducted by using the bit lines Br and Bw and the word line WL.

Incidentally, in this embodiment, the T-shaped magnetization free layer constituting the TMR element 2 is provided adjacent to the bit line Bw. Such a structure is employed that an opposite end portion of the TMR element 2 from the T-shaped magnetization free layer is connected to the bit line Br. The word line WL is disposed above the bit line Br via an insulating film (not shown). A yoke 22 is provided on the word line WL so as to extend up to side portions of the bit line Br, and yoke 8 is provided on the bit line Bw so as to approach to the T-shaped magnetization free layer of the TMR element 2. Since the yokes covering the bit line Br and the word line WL can be caused to approach to the T-shaped magnetization free layer of the TMR element in this manner, writing can be conducted with low power consumption and a low current. Further, since the TMR element having the T-shaped magnetization free layer is used, an excellent thermal stability can be achieved.

Seventh Embodiment

Next, a magnetic memory according to a seventh embodiment of the present invention will be explained with reference to FIGS. 19A and 19B. FIG. 19A is a view showing a structure of a memory cell array of a magnetic memory according to this embodiment and FIG. 19B is a sectional view of the memory cell array taken along line A-A shown in FIG. 19A. A magnetic memory according to this embodiment is constituted so as to conduct a simple matrix/double tunnel type reading. In this embodiment, TMR elements $2_1$ and $2_2$ with a T-shaped magnetization free layer are respectively disposed above and below a bit line BL. In case of conducting double tunnel type reading, a current is caused to flow between a reading bit line Br1 and a reading bit line Br2 and determination is made about the data "1" or "0" depending on whether resistance to the current flow is large or small. Accordingly, since a spin direction of a magnetic layer of a T-shaped magnetization free layer 3 coming in contact with a tunnel barrier layer 4 allows current flow in the bit line BL and the word line WL to conduct recording in an opposite direction, spin directions (magnetization directions) of the magnetic layers of the magnetization fixed layers 5 of the upper and lower TMR elements $2_1$ and $2_2$ coming in contact with the tunnel barrier layers 4 eventually become anti-parallel. Such a structure can be easily fabricated, for example, by using a synthetic pin structure for magnetization fixation of a one-side TMR element. Incidentally, yokes 8 are provided at side portions of the bit line BL, and yokes $22_1$ and $22_2$ are provided on word line WL1 and WL2.

The magnetic memory of this embodiment also has reduced power consumption and an excellent thermal stability.

Eighth Embodiment

Figures 20A, 20B:
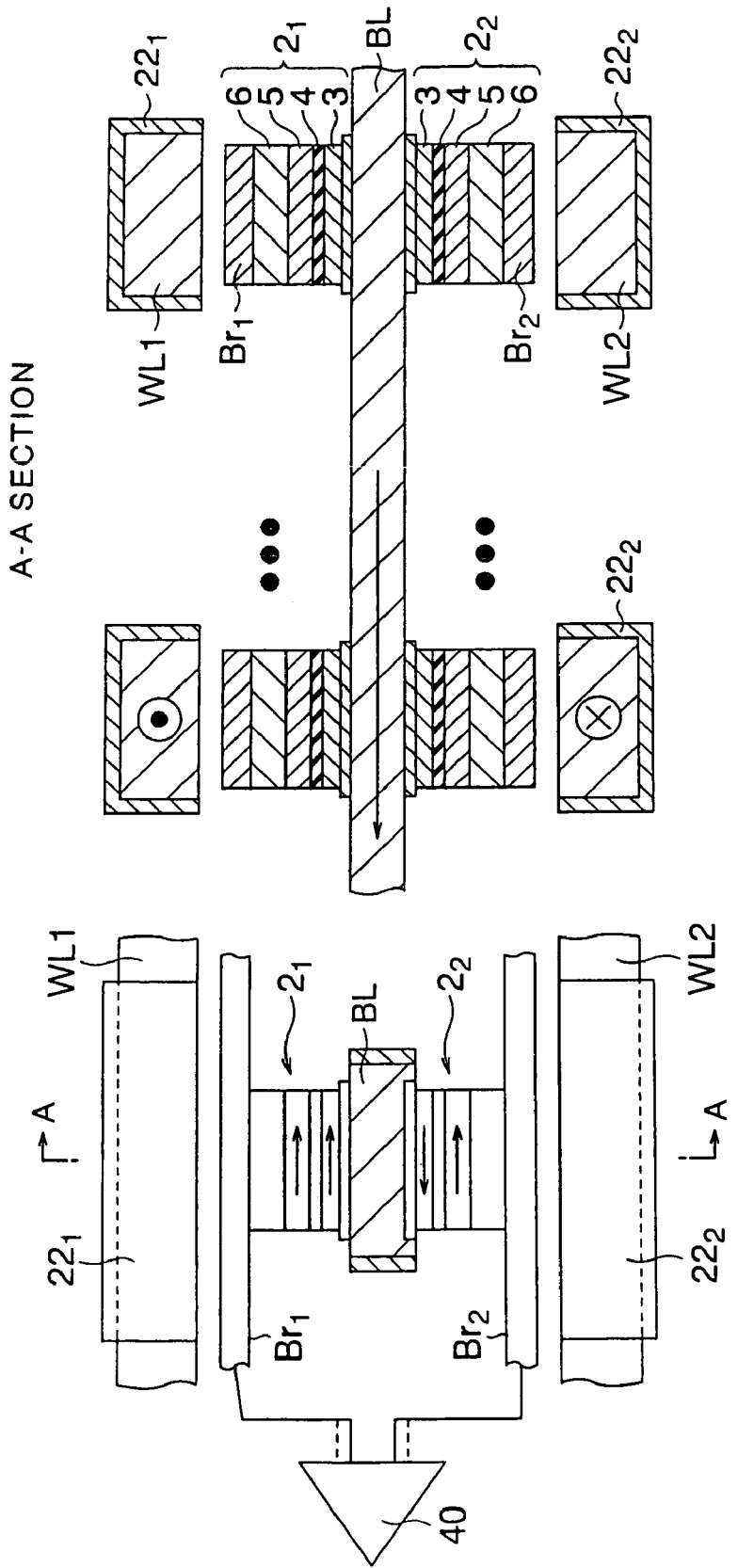
FIGS. 20A and 20B are views showing a structure of a magnetic memory according to an eighth embodiment of the present invention.

Next, a magnetic memory according to an eighth embodiment of the present invention will be explained with reference to FIGS. 20A and 20B. FIG. 20A is a view showing a structure of a memory cell array of a magnetic memory according to this embodiment, and FIG. 20B is a sectional view showing the memory cell array taken along line A-A shown in FIG. 20A. A magnetic memory according to this embodiment is constituted so as to conduct a simple matrix/differential amplifying type reading. In this embodiment, TMR elements $2_1$ and $2_2$ with a T-shaped magnetization free layer are provided above and below a bit line BL in the same manner as the seventh embodiment.

In writing, spin directions of magnetic layers of respective T-shaped magnetization free layers of the TRM elements $2_1$ and $2_2$ coming in contact with the tunnel barrier layers allow current flow in the bit line BL and the word lines WL1 and WL2 to conduct recording in an opposite direction. In reading, a current is branched from the bit line BL to a reading bit line BL1 and a reading bit line BL2 and the currents branched are differentially amplified by a differential amplifier 40. Therefore, such a design is made that spin directions (magnetization directions) of the magnetic layers of the magnetization fixed layers 5 coming in contact with the tunnel barrier layers 4 have the same direction while the spin directions of the magnetic layers of the T-shaped magnetization free layers 3 coming in contact with the tunnel barrier layers 4 have anti-parallel directions.

Incidentally, yokes 8 are provided at side portions of the bit line BL and yokes $22_1$ and $22_2$ are respectively provided on the word lines WL1 and WL2.

The magnetic memory of this embodiment also has reduced power consumption and an excellent thermal stability.

Ninth Embodiment

Next, a magnetic memory according to a ninth embodiment of the present invention will be explained with reference to FIGS. 21A and 21B. FIG. 21A is a view showing a structure of a unit memory cell of a magnetic memory according to this embodiment, and FIG. 21B is a sectional view showing the unit memory cell taken along line A-A shown in FIG. 21A. A magnetic memory according to this embodiment is provided with a plurality of common bit lines BL, a plurality of reading word lines Wr crossing these bit lines BL, and memory cells provided at respective crossing points fo the bit lines BL and the word line Wr. Each memory cell is provided with a cell bit line 30 branched from the common bit line BL, a TMR element 2 with a T-shaped magnetization free layer 3 and a writing cell selecting transistor 19.

The cell bit line 30 is provided with a first wiring portion 30a branched from the common bit line BL, a second wiring portion 30b which has one end connected to the first wiring portion 30a and to which a T-shaped magnetization free layer 3 of the TMR element 2 is provided adjacent, and a third wiring portion 30c which has one end connected to the other end of the second wiring portion 30b and has the other end connected to a diffusion region 19a of one of the source and the drain of a writing cell selecting transistor 19. The second wiring portion 30b is provided with a yoke 24. A diffusion region 19b of the other of the source and the drain of the writing cell selecting transistor 19 is connected with a connection plug. A current is caused to flow in the gate 19c of the writing cell selecting transistor 19 at a time of writing so that the writing cell selecting transistor 19 is turned ON.

Further, a reading word line Wr is connected to an opposite end portion of the TMR element 2 from the T-shaped magnetization free layer 3.

At a time of writing, the cell selecting transistor 19 is turned ON to cause a current pulse to flow in the common bit line BL and a current magnetic field is effectively applied to the T-shaped magnetization free layer 3 coming in contact with the cell bit line 30b, thereby reversing the direction of the spin. At this time, since the yoke 24 has been provided, a writing current value can be reduced more efficiently.

Incidentally, in this embodiment, a writing current is caused to flow in only the common bit line BL at a time of writing.

The magnetic memory of this embodiment also has reduced power consumption and an excellent thermal stability.

Tenth Embodiment

Figures 22A, 22B:
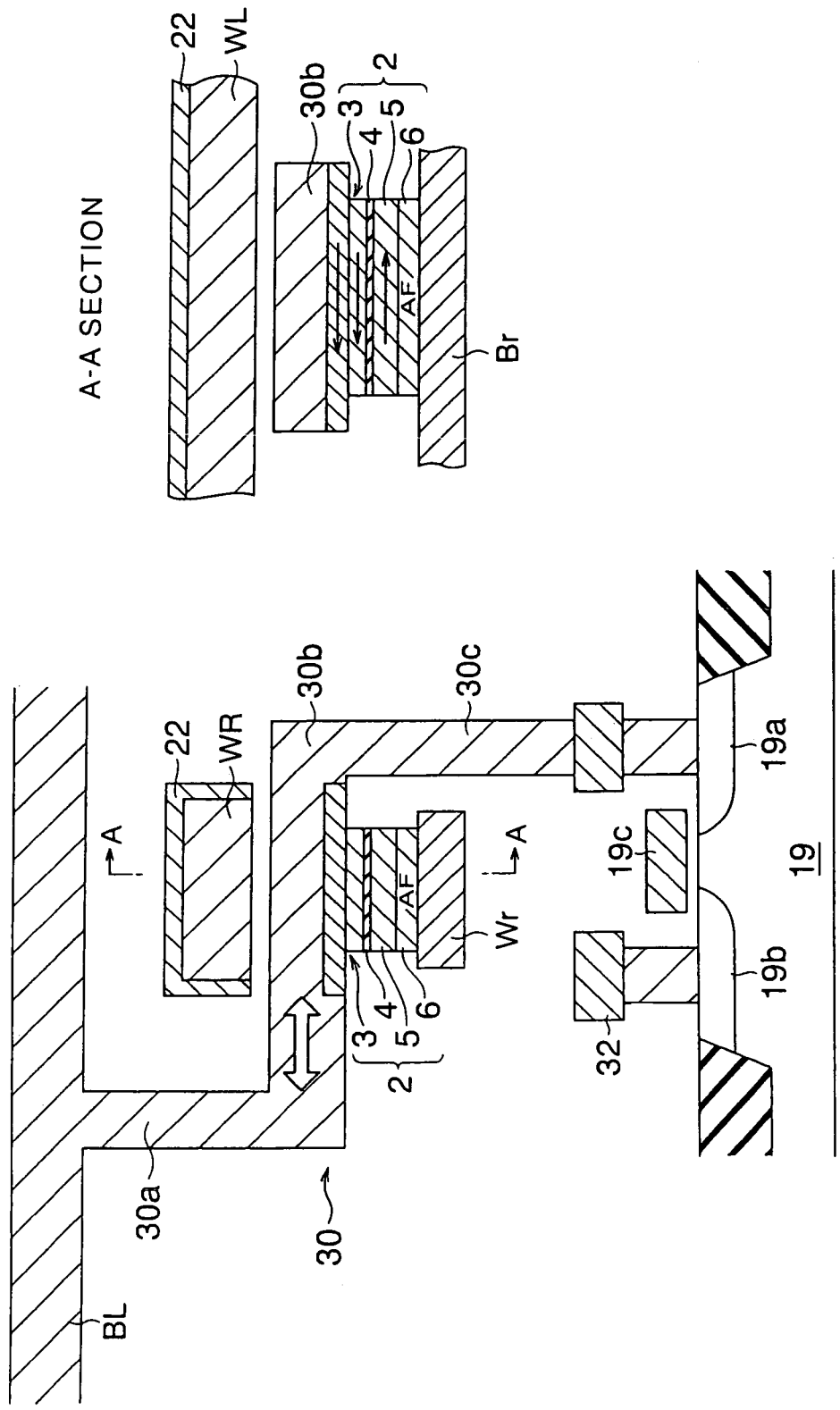
FIGS. 22A and 22B are views showing a structure of a magnetic memory according to a tenth embodiment of the present invention.

Next, a magnetic memory according to a tenth embodiment of the present invention will be explained with reference to FIGS. 22A and 22B. FIG. 22A is a view showing a structure of a unit memory cell of a magnetic memory according to this embodiment, and FIG. 22B is a sectional view showing the unit memory cell taken along line A-A shown in FIG. 22A. A magnetic memory according to this embodiment is constituted such that the yoke 24 provided on the second wiring portion 30b of the cell bit line 30 is removed from the ninth embodiment shown in FIGS. 21A and 21B and a writing word line WL has been provided above the second wiring portion 30b via an insulating film (not shown). Incidentally, the writing word line WL is provided with a yoke 22.

Accordingly, in this embodiment, a writing current is caused to flow in not only the common bit line BL but also the writing word line WL at a time of writing. For this reason, a current per wiring can be reduced.

The magnetic memory of this embodiment also has reduced power consumption and an excellent thermal stability.

Eleventh Embodiment

Figure 23B:
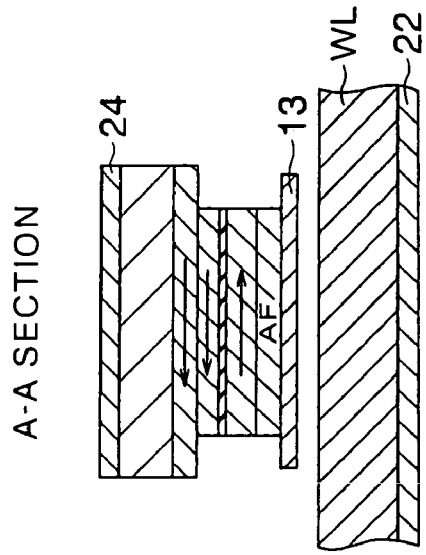
FIGS. 23A and 23B are views showing a structure of a magnetic memory according to an eleventh embodiment of the present invention.
Figure 23A:
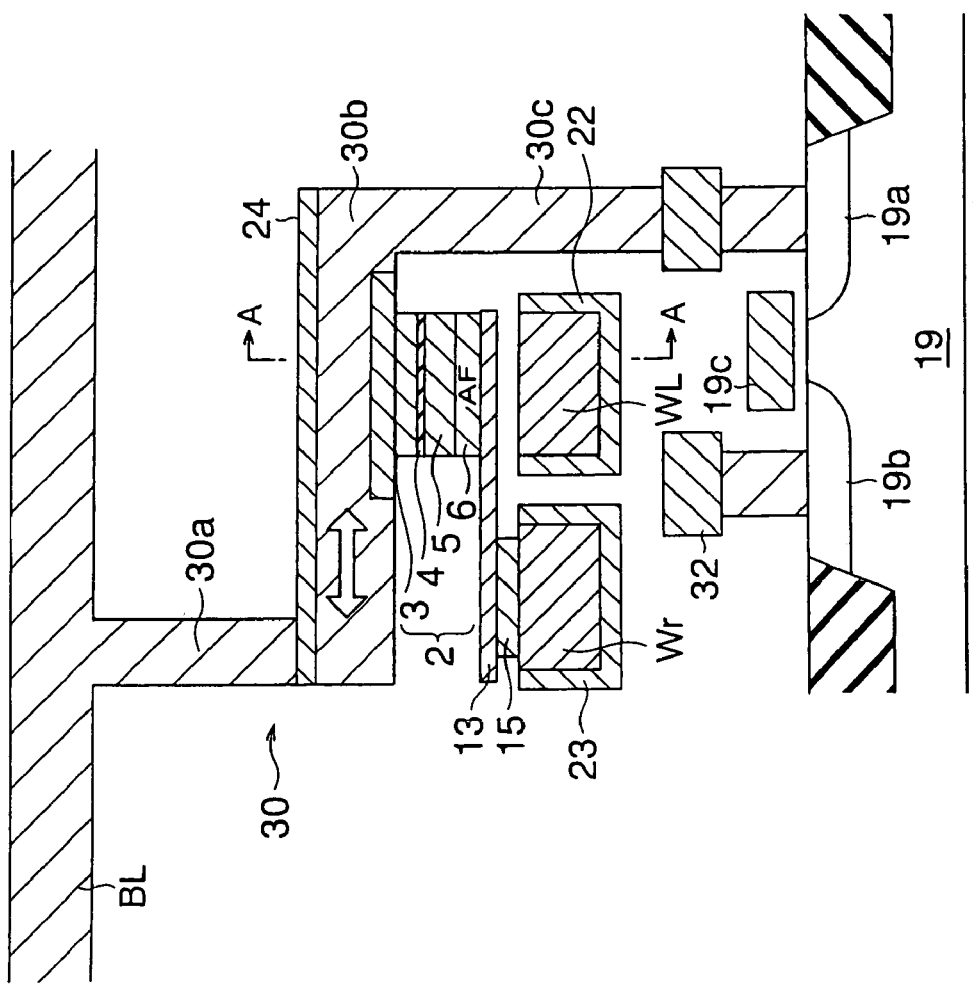

Next, a magnetic memory according to an eleventh embodiment of the present invention will be explained with reference to FIGS. 23A and 23B. FIG. 23A is a view showing a structure of a unit memory cell of a magnetic memory according to the embodiment, and FIG. 23B is a sectional view showing the unit memory cell taken along line A-A shown in FIG. 23A. A magnetic memory according to this embodiment is constituted such that the reading word line Wr which has been directly connected to the opposite end portion of the TMR element 2 from the T-shaped magnetization free layer 3 is connected to the opposite side via a leading electrode 13 and a connection plug 15 and a writing word line WL is provided below an opposite end portion of the TMR element 2 from the T-shaped magnetization free layer 3 via an insulating film (not shown) in the ninth embodiment shown in FIGS. 21A and 21B. The reading word line Wr and the writing word line WL are formed so as to be positioned on the same layer. Incidentally, the reading word line Wr and the writing word line WL are respectively provided with yokes 23 and 22.

Accordingly, in this embodiment, a writing current is caused to flow in not only the common bit line BL but also the writing word line WL at a time of writing. For this reason, a current per wiring can be reduced.

The magnetic memory of this embodiment also has reduced power consumption and an excellent thermal stability.

Twelfth Embodiment

Figures 24A, 24B:
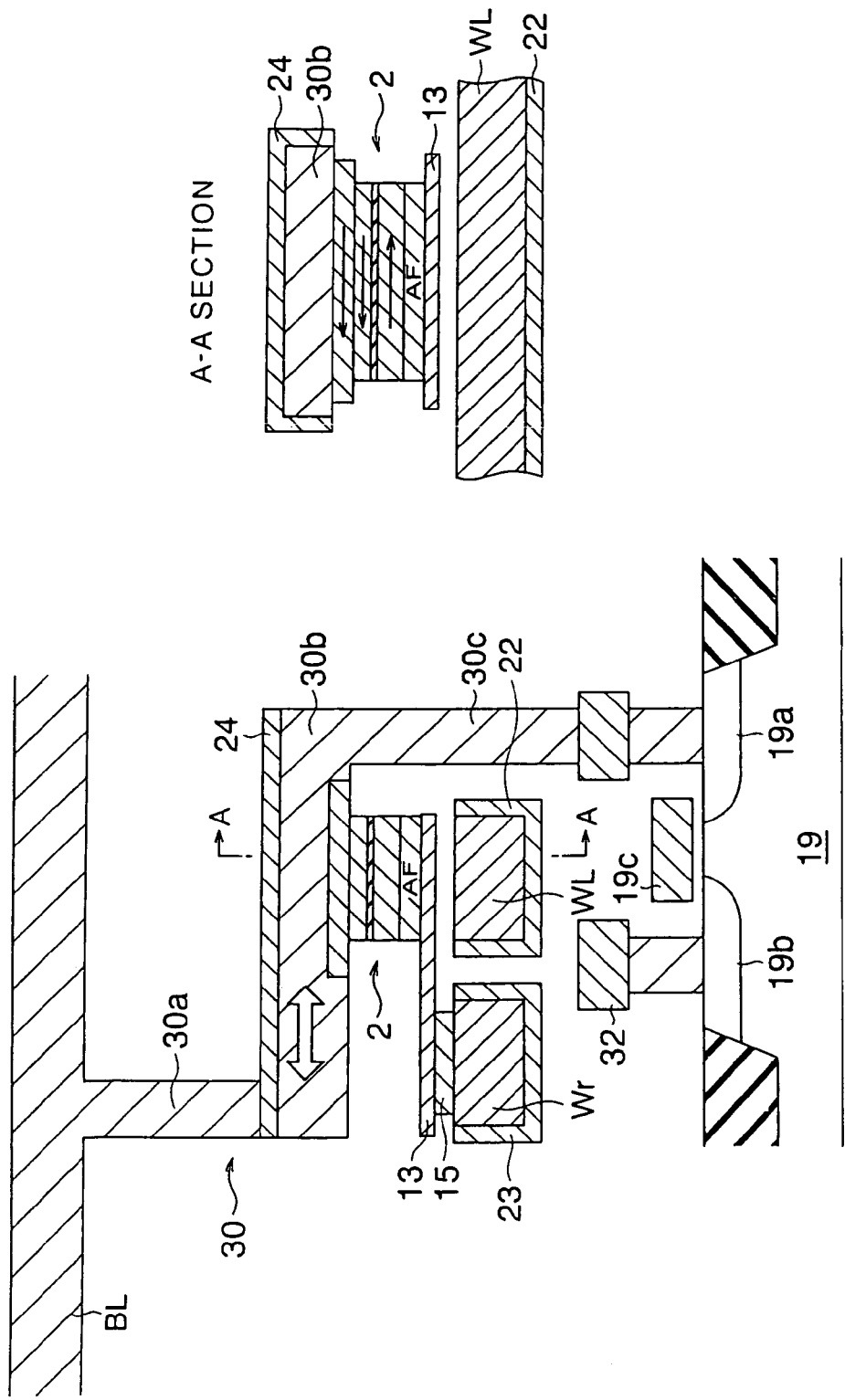
FIGS. 24A and 24B are views showing a structure of a magnetic memory according to a twelfth embodiment of the present invention.

Next, a magnetic memory according to a twelfth embodiment of the present invention will be explained with reference to FIGS. 24A and 24B. FIG. 24A is a view showing a structure of a unit memory cell of a magnetic memory according to the embodiment, and FIG. 24B is a sectional view showing the unit memory cell taken along line A-A shown in FIG. 24A. A magnetic memory according to this embodiment is constituted such that the yoke 24 provided on the second wiring portion of the cell bit line 30 is also caused to extend to side portions of the second wiring portion 30b in the eleventh embodiment shown in FIGS. 23A and 23B.

This embodiment can further be reduced in writing current as compared with the eleventh embodiment. The magnetic memory of this embodiment also has reduced power consumption and an excellent thermal stability.

Thirteenth Embodiment

Figure 25:
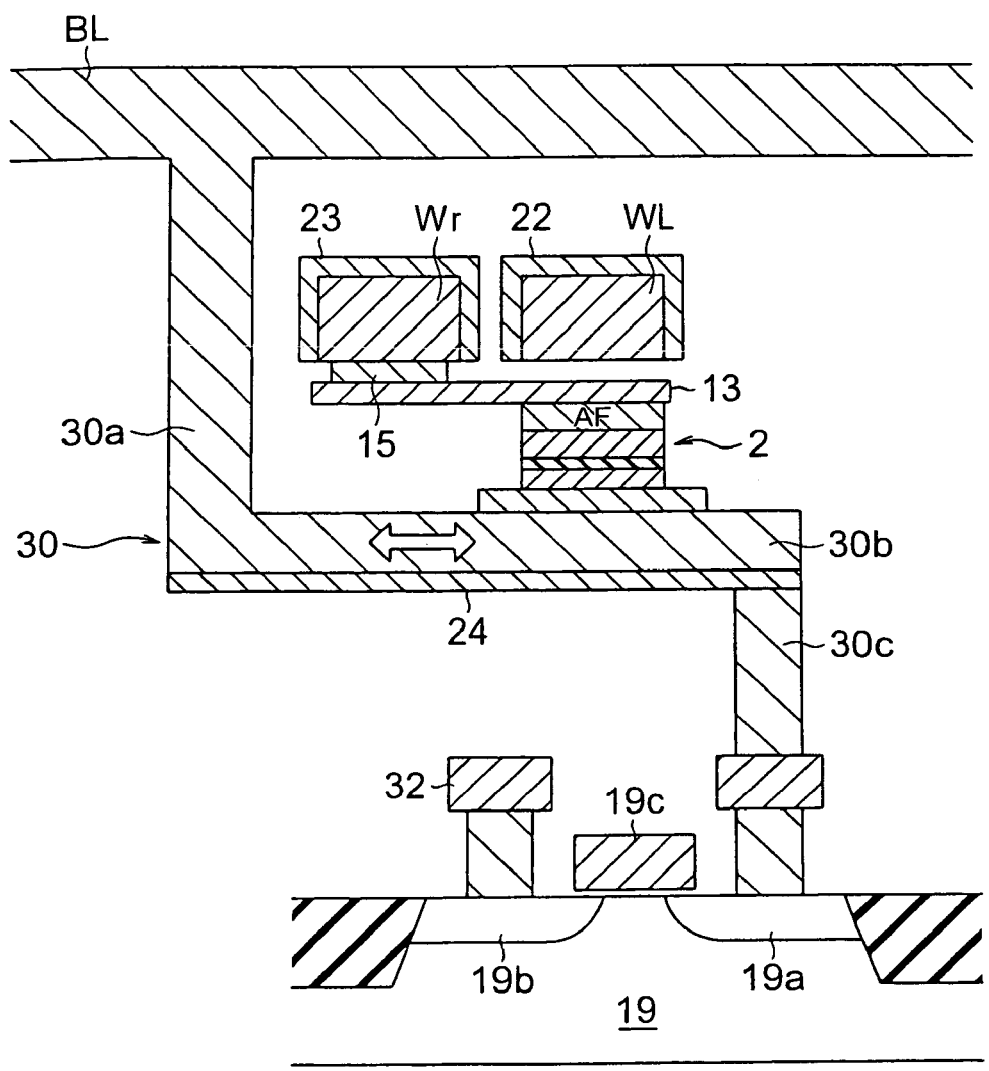
FIG. 25 is a view showing a structure of a magnetic memory according to a thirteenth embodiment of the present invention.

Next, a magnetic memory according to a thirteenth embodiment of the present invention will be explained with reference to FIG. 25. FIG. 25 is a view showing a structure of a unit memory cell of a magnetic memory according to this embodiment. A magnetic memory according to this embodiment is constituted such that the connection position between the T-shaped magnetization free layer 3 of the TMR element 2 and the second wiring portion 30b of the cell bit line 30 is changed from a position below the second wiring portion 30b to a position above the same and the position where the yoke 24 is provided is changed from a position above the second wiring portion 30b to a position below the same in the twelfth embodiment shown in FIGS. 24A and 24B. For this reason, the leading electrode 13, the connection plug 15, the reading word line Wr and the writing word line WL have been provided above the second wiring portion 30b.

The magnetic memory of this embodiment also has reduced power consumption and an excellent thermal stability.

Fourteen Embodiment

Figure 26:
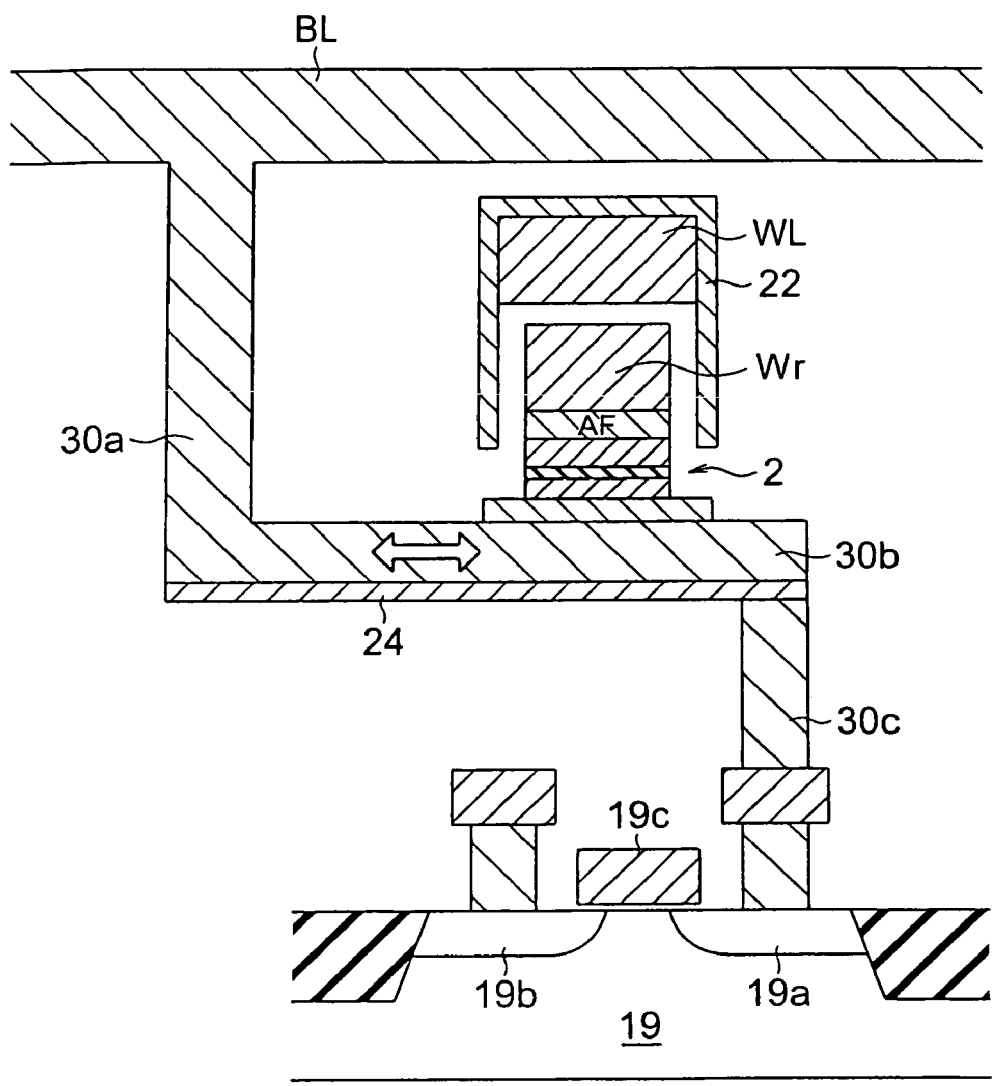
FIG. 26 is a view showing a structure of a magnetic memory according to a fourteenth embodiment of the present invention.

Next, a magnetic memory according to a fourteenth embodiment of the present invention will be explained with reference to FIG. 26. FIG. 26 is a view showing a structure of a unit memory cell of a magnetic memory according to this embodiment. A magnetic memory according to this embodiment is constituted such that the reading word line Wr is connected to an opposite end portion of the TMR element 2 from the T-shaped magnetization free layer and the writing word line WL is arranged above the reading word line Wr via an insulating film (not shown) in the thirteenth embodiment shown in FIG. 25. A yoke 22 extending up to the vicinity of the magnetization fixed layer of the TMR element 2 is provided on the writing word line WL.

The magnetic memory of this embodiment also has reduced power consumption and an excellent thermal stability.

In the magnetic memories according to the tenth to fourteenth embodiments shown in FIGS. 22A to 26, reading is conducted in the same manner as the magnetic memory of the ninth embodiment shown in FIGS. 21A and 21B.

Fifteenth Embodiment

Figure 27:
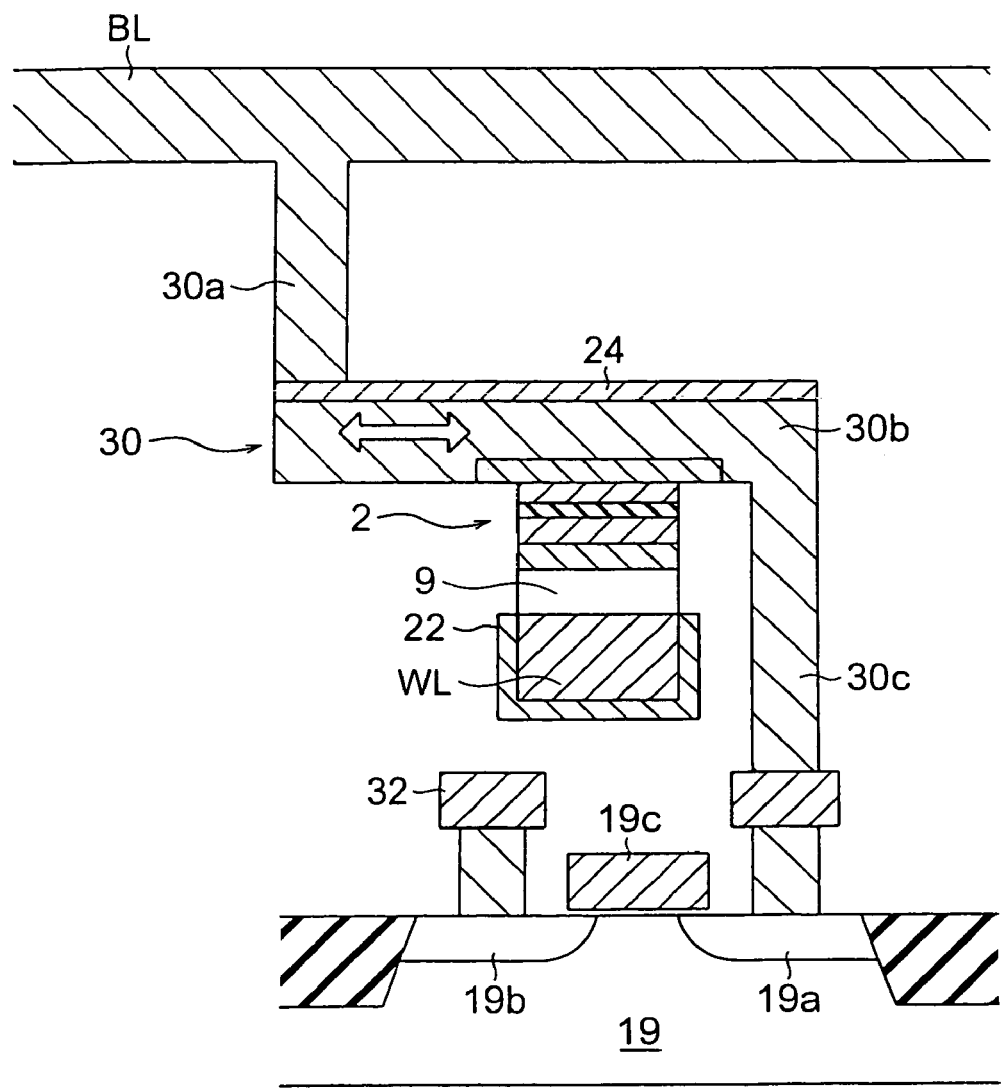
FIG. 27 is a view showing a structure of a magnetic memory according to a fifteenth embodiment of the present invention.

Next, a magnetic memory according to a fifteenth embodiment of the present invention will be explained with reference to FIG. 27. FIG. 27 is a view showing a structure of a unit memory cell of a magnetic memory according to the embodiment. A magnetic memory according to this embodiment is constituted such that, instead of the reading word line Wr, a reading/writing word line WL is connected to an opposite end portion of the TMR element 2 from the T-shaped magnetization free layer via a diode 9 in the ninth embodiment shown in FIGS. 21A and 21B. Incidentally, the word line WL is covered with a yoke 22 except for a connection surface with the diode 9.

The magnetic memory of this embodiment also has reduced power consumption and an excellent thermal stability.

Sixteenth Embodiment

Figure 28:
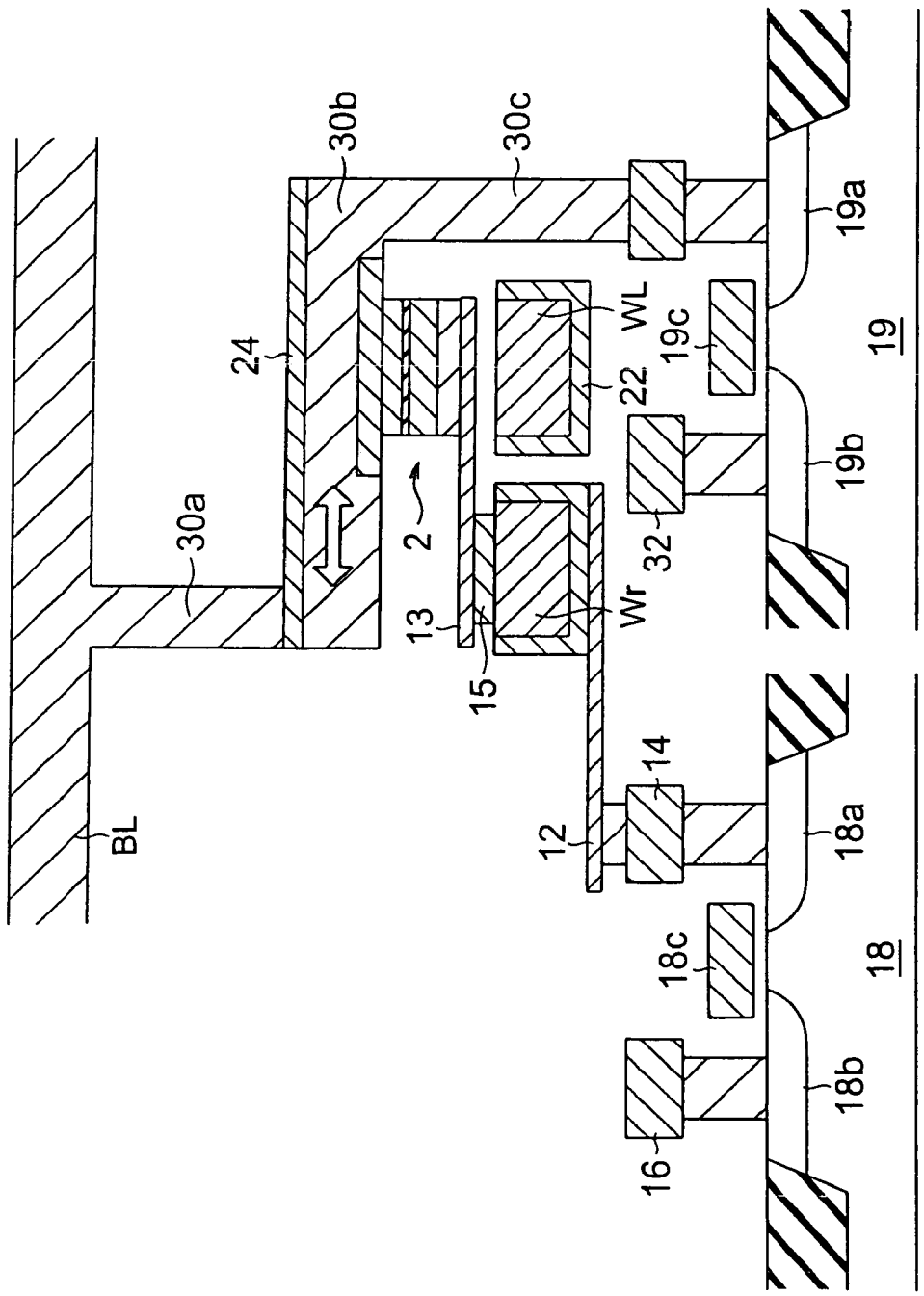
FIG. 28 is a view showing a structure of a magnetic memory according to a sixteenth embodiment of the present invention.

Next, a magnetic memory according to a sixteenth embodiment of the present invention will be explained with reference to FIG. 28. FIG. 28 is a view showing a structure of a unit memory cell of a magnetic memory according to the embodiment. A magnetic memory according to this embodiment is constituted such that one region of the source region and the drain region of the reading cell selecting transistor 18 is connected to the reading word line Wr via a leading electrode 12 and a connection plug 14 in the eleventh embodiment shown in FIGS. 23A and 23B. A connection plug 16 connected to the other region of the source region and the drain region of the reading cell selecting transistor 18 is connected with a power source.

In the embodiment, reading is conducted by turning ON the reading cell selecting transistor 18 to apply a voltage between the common bit line BL and the power source connected to the connection plug 16, thereby reading a current flowing in the TMR element 2 by a sense amplifier (not shown).

The magnetic memory of this embodiment also has reduced power consumption and an excellent thermal stability.

Seventeenth Embodiment

Figures 29A, 29B:
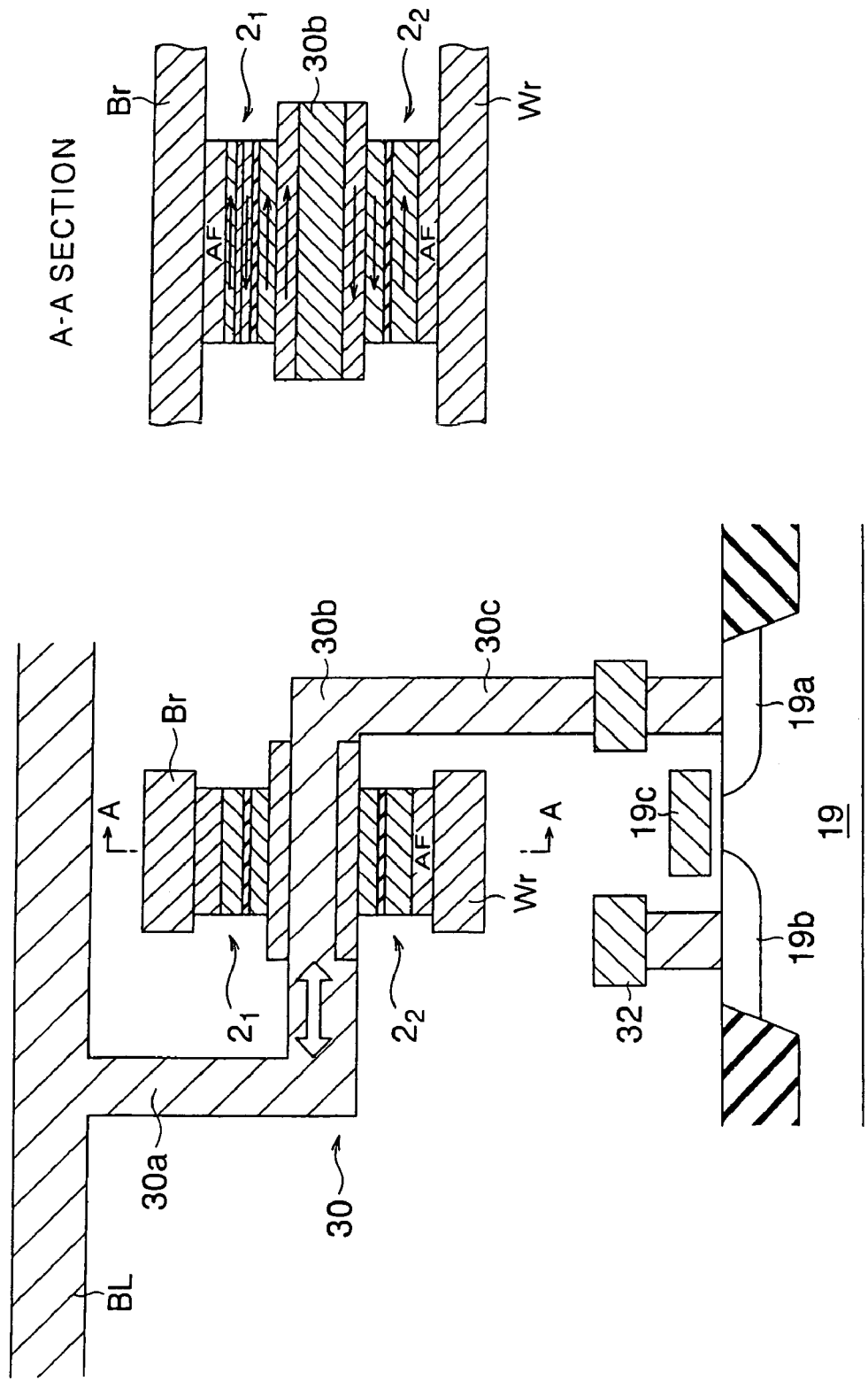
FIGS. 29A and 29B are views showing a structure of a magnetic memory according to a seventeenth embodiment of the present invention.

Next, a magnetic memory according to a seventeenth embodiment of the present invention will be explained with reference to FIGS. 29A and 29B. FIG. 29A is a view showing a structure of a unit memory cell of a magnetic memory according to this embodiment, and FIG. 29B is a sectional view of the unit memory cell taken along line A-A shown in FIG. 29A. A magnetic memory according to the embodiment is constituted such that the TMR element 2 and the yoke 24 are removed and the TMR elements $2_1$ and $2_2$ are provided above and below the second wiring portion 30b of the cell bit line 30 in the ninth embodiment shown in FIGS. 21A and 21B. Such a structure is also employed in this embodiment that the T-shaped magnetization free layers of the TMR elements $2_1$ and $2_2$ are respectively connected to the second wiring portion 30b, and a reading bit line Br and a reading word line Wr are connected to opposite end portions of the TMR elements $2_1$ and $2_2$ from the T-shaped magnetization free layers.

The magnetic memory of this embodiment also has reduced power consumption and an excellent thermal stability.

Eighteenth Embodiment

Figure 30A:
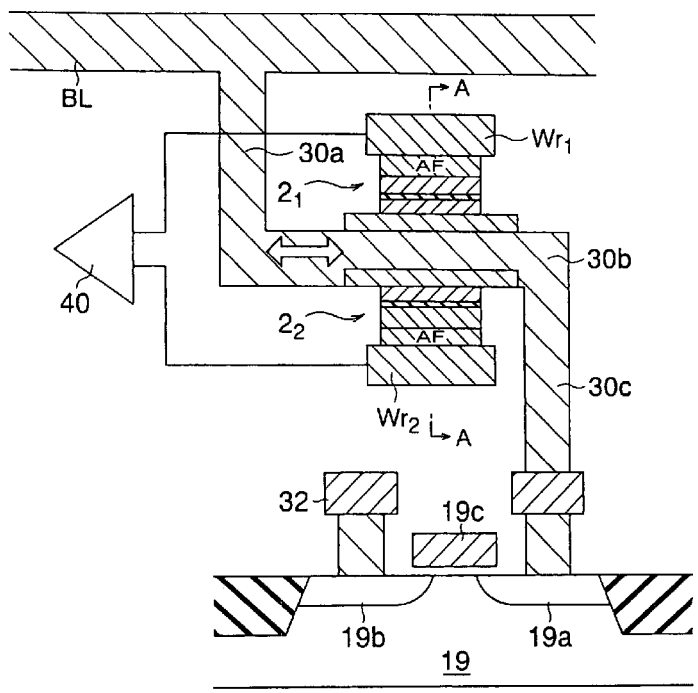
FIGS. 30A and 30B are views showing a structure of a magnetic memory according to an eighteenth embodiment of the present invention.
Figure 30B:
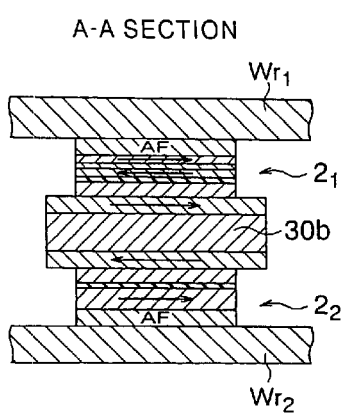

Next, a magnetic memory according to an eighteenth embodiment of the present invention will be explained with reference to FIGS. 30A and 30B. FIG. 30A is a view showing a structure of a unit memory cell of a magnetic memory according to the embodiment, and FIG. 30B is a sectional view showing the unit memory cell taken along line A-A shown in FIG. 30A. A magnetic memory according to the embodiment is constituted such that a reading word line Wr1 is provided instead of the reading bit line Br connected to the TMR element $2_1$, the reading word line Wr connected to the TMR element $2_2$ is changed to a reading word line Wr2, and reading currents flowing in the reading word lines Wr1 and Wr2 are differentially read out using the differential amplifier 40 in the seventeenth embodiment shown in FIGS. 29A and 29B.

The magnetic memory of this embodiment also has reduced power consumption and an excellent thermal stability.

Nineteenth Embodiment

Next, a manufacturing method of a TMR element according to a nineteenth embodiment of the present invention will be explained with reference to FIGS. 31A to 32E. A manufacturing method according to this embodiment is for manufacturing a TMR element according to the fourth modification of the first embodiment shown in FIG. 6, and its manufacturing steps are shown in FIGS. 31A to 32E.

A lower wiring 50, a TMR film (or element) 52, a multi-layered film 54 comprising a magnetic layer and a non-magnetic layer anti-ferromagnetically coupled, a metal film 56 comprising Pt or Ru, and a metal hard mask 58 were first formed sequentially on a substrate (not shown) (refer to FIG. 31A). In the embodiment, the lower wiring 50 was a three-layered film comprising Ta/Al—Cu/Ta, and the TMR film was constituted by stacking Ta (5 nm)/Ru (3 nm)/Ir—Mn (10 nm)/CoFe (3 nm)/Ru (1 nm)/CoFe (3.25 nm)/AlOx (1.2 nm)/CoNiFe (2 nm)/Ru (0.95 nm)/NiFe (2 nm) from a bottom thereof. The multi-layered film 54 obtained by repeating stacking of a non-magnetic layer with a film thickness of 2.45 nm comprising Ru and a magnetic layer with a film thickness of 3 nm comprising CoFeB ten times, the metal film 56 comprising Pt or Ru, and the metal hard mask 58 with 50 nm comprising Ta were formed on the TMR film 52. Subsequently, anneal was conducted in a magnetic field, application of a resist was then conducted, and a resist pattern 60 was formed by conducting PET on the resist, as shown in FIG. 31A.

Next, as shown in FIG. 31B, patterning of the metal hard mask 58 was conducted by utilizing the resist pattern 60 as a mask with chlorine gas, for example, using RIE process. At this time, the etching was stopped at the Ru or Pt film 56. Thereafter, as shown in FIG. 31C, the resist pattern 60 was peeled off and milling or RIE was conducted down to an anti-ferromagnetic layer comprising IrMn and constituting the TMR film by using the metal hard mask 58 as a mask, so that junction-separation is performed to a ferromagnetic tunnel junction. A plane figure of the tunnel junction was a circle with an aspect ratio of 1:1. The size of the junction had a diameter of 0.18 μm.

Next, as shown in FIG. 31D, a protective film 62 comprising SiOx was formed. Subsequently, as shown in FIG. 31E, a resist is applied, PEP was conducted to form a resist pattern 64, and patterning of the lower electrode 50 is conducted by utilizing the resist pattern 64 as a mask, for example, using RIE.

Next, as shown in FIG. 31F, after the resist pattern 64 was removed, an inter-layer insulating film 66 comprising SiOx was formed.

Figure 32A:
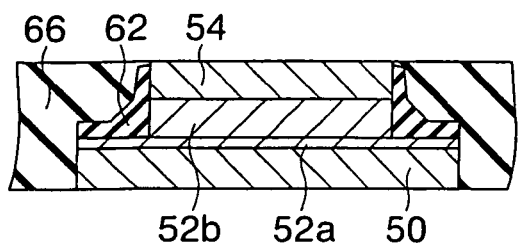
FIGS. 32A to 32E are sectional views showing manufacturing steps of the magneto-resistance effect element according to the nineteenth embodiment of the present invention.

Next, as shown in FIG. 32A, the inter-layer insulating film 66 was etched back to conduct planarization and expose either layer of multiple layers of Ru (2.45 nm) and CoFeB (3 nm) in an upper portion of TMR film 54.

Figure 32B:
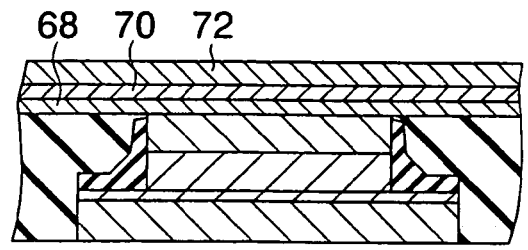

Next, as shown in FIG. 32B, after sputter-etching, a magnetic layer 68, a metal layer 70 comprising Pt or Ru, and a metal hard mask 72 were sequentially formed by sputtering. Ni—Fe was used for the magnetic layer 68 and Ta was used for the hard mask 72.

Figure 32C:
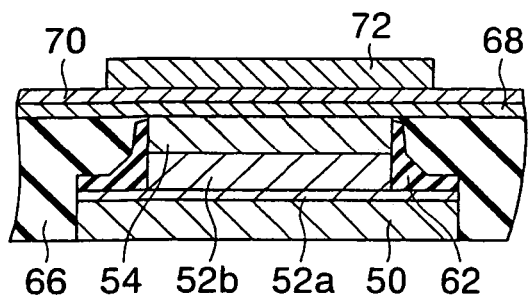

Next, a resist pattern (not shown) was formed and the hard mask 72 was patterned by utilizing the resist pattern as a mask and using RIE (refer to FIG. 32C). Subsequently, after the resist patterned was removed, the metal hard mask 72 was utilized as a mask and the Ni—Fe magnetic layer 68 was formed in a shape (a mask-shaped octagon: aspect ratio (long axis/short axis)/long axis=2 μm and short axis=0.25 μm) shown in FIG. 11c.

Figure 32D:
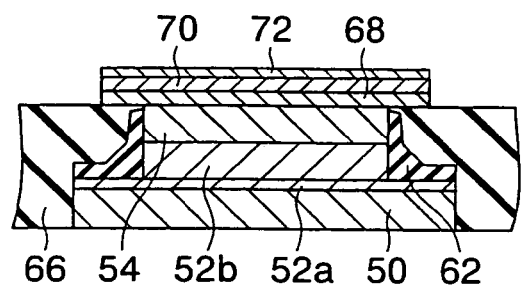
Figure 32E:
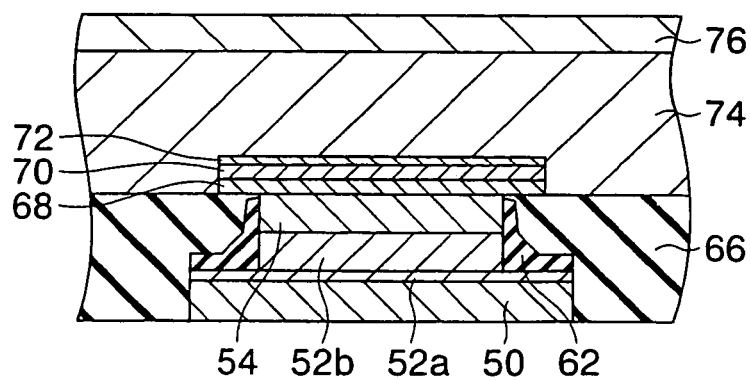

Next, as shown in FIG. 32D, an upper wiring 74 and a magnetic covering layer (yoke) 76 were formed. Thereafter, a resist pattern (not shown) was formed on the yoke 76, the yoke and the upper wiring 74 were patterned by utilizing the resist pattern as a mask, and a TMR element having a T-shaped magnetization free layer shown in FIG. 32E was manufactured.

Thereafter, anneal was conducted in a magnetic field such that a magnetic field was applied in a long axis direction of the Ni—Fe magnetic layer 68 just below the upper wiring 74. A pulse current was applied to the upper wiring 74 in a stepwise manner while it was being gradually increased from a value of 0.01 mA. An element resistance was measured for each step and a resistance change was observed when the pulse current was 0.27 mA. A pulse current was caused to flow in a direction of magnetization hard axis, a magnetic field of 10 Oe was applied in the direction of magnetization hard axis and a similar experiment was conducted. Reserve was observed when the current pulse was 0.15 mA. Thereafter, ten elements were maintained at 120° C. for one week while they were being kept in "1" state that a TMR element resistance was high and ten elements were maintained at 120° C. for one week while they were being kept in "0" state that the TMR element resistance was low. As a result, reservation of data was confirmed in these elements and the elements each developed desirable characteristics as a non-volatile magnetic memory.

Twentieth Embodiment

Next, a manufacturing method of a TMR element according to a twentieth embodiment of the present invention will be explained with reference to FIGS. 33A to 34C. A manufacturing method according to this embodiment is for manufacturing a TMR element according to the eighth modified embodiment of the first embodiment shown in FIG. 10, and its manufacturing steps are shown in FIGS. 33A to 34C.

A magnetic covering layer (yoke) 80 and a lower wiring 82 were formed on a substrate (not shown) by sputtering, a resist pattern (not shown) was formed, and patterning was conducted using the resist pattern. Then, SiOx was deposited and planarization was conducted by CMP (refer to FIG. 33A).

Figure 33A:
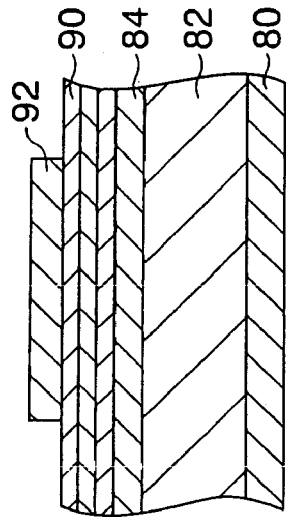
FIGS. 33A to 33F are sectional views showing manufacturing steps of a magneto-resistance effect element according to an twentieth embodiment of the present invention.
Figure 33B:
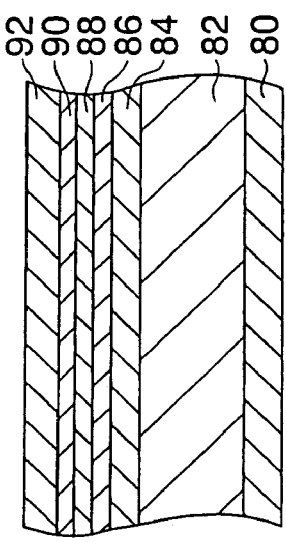

Next, as shown in FIG. 33B, a magnetic layer 84, a multi-layered film 86 formed by stacking a magnetic layer and a non-magnetic layer non-ferromagnetically coupled, a TMR film 88, a metal film 90 comprising Pt or Ru, and a metal hard mask 92 were formed. In this embodiment, the magnetic covering layer 80 comprised Ni—Fe, the lower wiring 82 was a three-layered film comprising Ta/Al—Cu/Ta, the magnetic layer 84 was a three-layered film comprising Ni—Fe (3 nm)/Ru (1.5 nm)/Ni—Fe (2 nm), the multi-layered film 86 was a layer obtained by repeating stacking of CoFeB (3 nm) and Ru (2.45 nm) ten times, and the TMR film 88 was a film obtained by stacking Pt—Mn (14 nm)/CoFe (3 nm)/Ru (1 nm)/CoFe (3.25 nm)/AlOx (1.2 nm)/CoNiFe (2 nm)/Ru (0.95 nm)/NiFe (2 nm) in this order from the top. A metal film 90 comprising Pt or Ru and a metal hard mask 92 with a film thickness of 50 nm comprising Ta were formed on the TMR film 88.

Figure 33C:
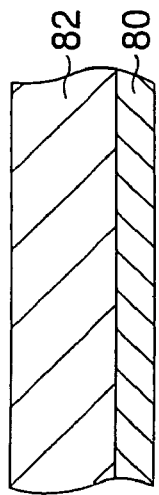

Subsequently, after anneal was conducted in a magnetic field, a resist pattern (not shown) was formed, and anisotropic etching then was conducted on the metal hard mask 92 by utilizing the resist pattern as a mask with chlorine gas (refer to FIG. 33C). At this time, the etching was stopped at the metal film 90 comprising Ru or Pt.

Figure 33D:
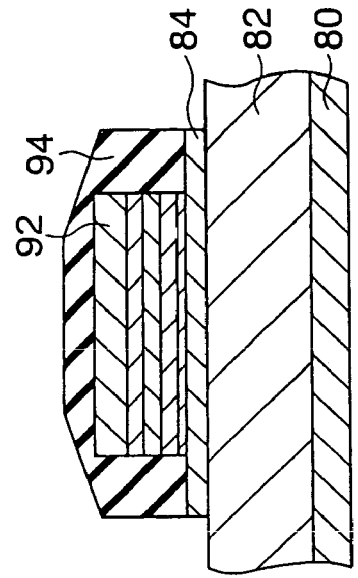

Thereafter, junction-separation was conducted on the ferromagnetic tunnel junction by peeling off the resist pattern and utilizing the metal hard mask 92 as a mask to conduct milling or RIE down to an intermediate portion of the multi-layered film 86 of ten layers comprising CoFeB (3 nm)/Ru (2.45 nm) (refer to FIG. 33D). The plane shape of the tunnel junction was formed in a circular shape with an aspect ratio of 1:1. The size of the tunnel junction had a diameter of 0.18 μm.

Figure 33E:
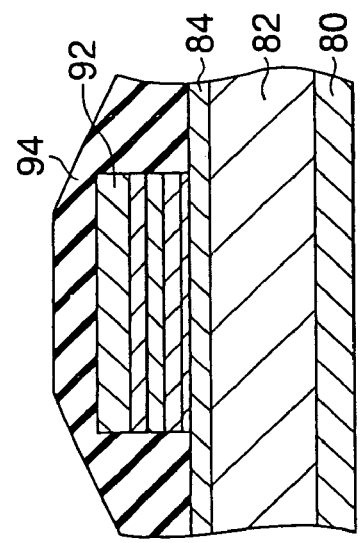

Subsequently, as shown in FIG. 33E, a SiOx film 94 was formed. Thereafter, a resist pattern (not shown) was formed and the SiOx film 94 was patterned by utilizing the resist pattern as a mask and using, for example, RIE process.

Figure 33F:
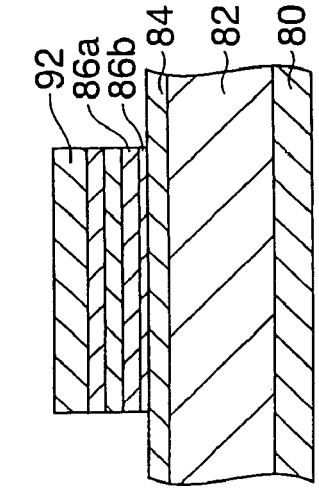

Next, after the resist pattern was removed, the remaining some layers of the multi-layered film 86 comprising CoFeB (3 nm)/Ru (2.45 nm) was patterned by utilizing the SiOx film 94 patterned as a mask and using milling or RIE process, and the Ni—Fe layer 84 was patterned (refer to FIG. 33F). A plane structure was a shape (a mask-shaped octagon: aspect ratio (long axis/short axis)=1, short axis=long axis=0.25 μm) as shown in FIG. 11E.

Figure 34A:
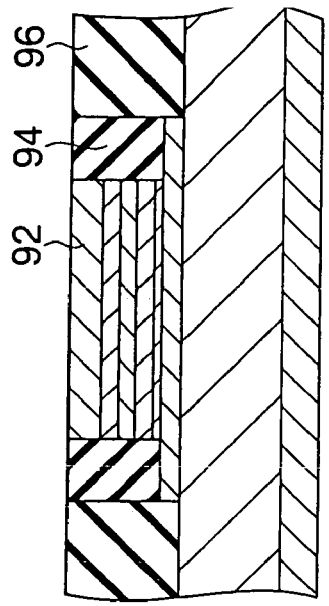
FIGS. 34A to 34C are sectional views showing manufacturing steps of the magneto-resistance effect element according to the twentieth embodiment of the present invention.
Figure 34B:
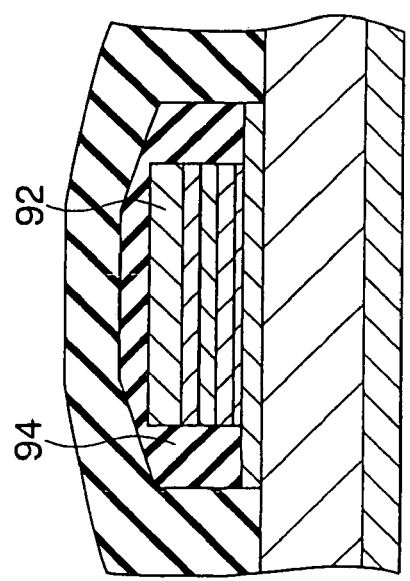

Next, as shown in FIG. 34A, after a SiOx film 96 was deposited, planarization was conducted by using CMP and etch back and exposure of a Ta film constituting the metal hard mask 92 was conducted (refer to FIG. 34B).

Figure 34C:
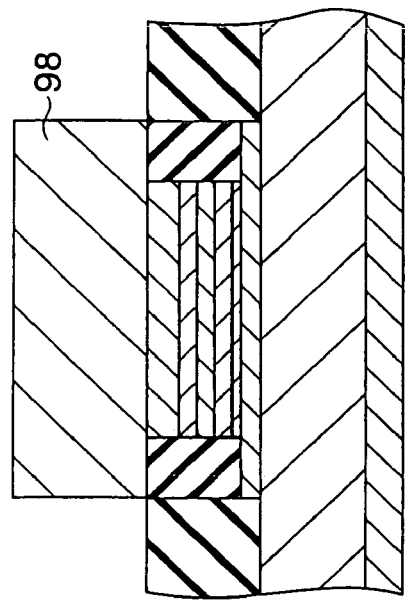

Thereafter, after sputter-etching was conducted, an upper wiring 98 was formed to manufacture a TMR element with a T-shape magnetization free layer having a structure shown in FIG. 34C.

Thereafter, anneal was conducted in a magnetic field and a magnetic field was applied in a direction of magnetization easy axis of the Ni—Fe layer and (CoFeB (3 nm)/Ru (2.45 nm)) X layer just below the upper wiring 98. A pulse current was applied to the upper wiring 98 in a stepwise manner while it was being gradually increased from a value of 0.01 mA. An element resistance was measured for each step and a resistance change was observed when the pulse current was 0.26 mA. A pulse current was caused to flow in a direction of magnetization hard axis, a magnetic field of 10 Oe was applied in the direction of magnetization hard axis and a similar experiment was conducted. Reserve was observed when the current pulse was 0.14 mA. Thereafter, ten TMR elements were maintained at 120° C. for one week while they were being kept in "1" state that a TMR element resistance was high and ten TMR elements were maintained at 120° C. for one week while they were being kept in "0" state that the TMR element resistance was low. As a result, reservation of data was confirmed in these elements and the elements each developed desirable characteristics as a non-volatile magnetic memory.

Twenty-First Embodiment

Figure 35B:
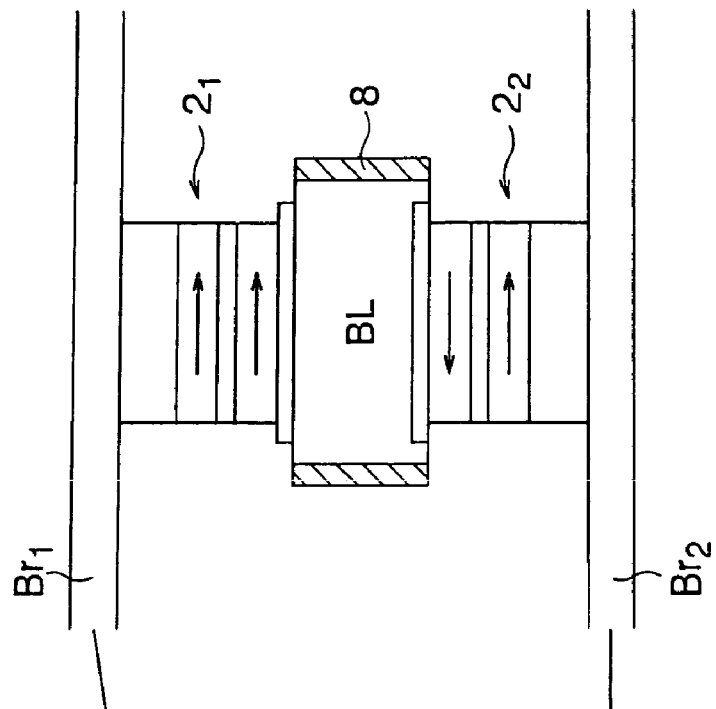
FIGS. 35A and 35B are sectional views showing a structure of a TMR element having a T-shaped magnetization free layer which is used in the magnetic memories according to the seventh and the eighth embodiments.
Figure 35A:
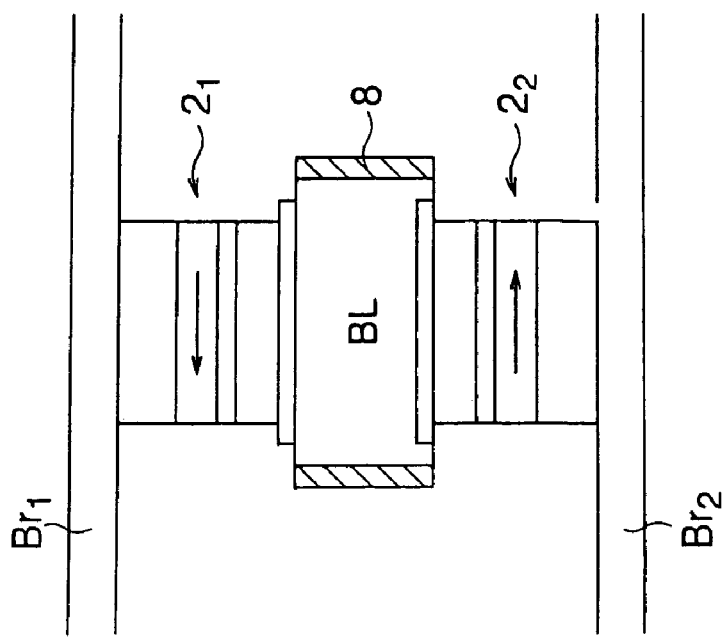

A TMR element with the T-shaped magnetization free layer shown in FIGS. 35A and 35B, which was used in a magnetic memory according to the seventh and the eighth embodiments shown in FIGS. 19A to 20B was manufactured as a twenty-first embodiment and performances thereof were examined. FIG. 35A shows a structure for examining a double junction reading architecture and FIG. 35B shows a structure for examining a differential reading architecture. A manufacturing process is basically constituted with a combination of the nineteenth embodiment and the twentieth embodiment. The covering magnetic layer 8 of the bit line BL can be easily manufactured by, after patterning the bit line BL, forming the covering magnetic layer 8 to conduct milling the same from a vertical direction. Various materials used in this embodiment were the same materials as used in the nineteenth and twentieth embodiments. The size and the shape of the element were similar to those in the twentieth embodiment.

As described above, the case of the double junction reading and the case of the differential reading are different in direction of spin of a magnetization fixed layer coming in contact with a tunnel barrier layer. This is because the magnetization fixed layer can be easily manufactured by using a multi-layered film of a magnetic layer/a non-magnetic layer anti-ferromagnetically coupled.

A pulse current was applied to the bit line BL shown in FIG. 35A in a stepwise manner while it was being gradually increased from 0.01 mA. Element resistances of the upper and lower TMR elements $2_1$ and $2_2$ were measured for each step and changes of both the resistances thereof were observed when the pulse current was 0.28 mA. A pulse current was caused to flow in a direction of magnetization hard axis, a magnetic field of 10 Oe was applied in the direction of magnetization hard axis and a similar experiment was conducted. Inversion of both the upper and lower TMR elements $2_1$ and $2_2$ was observed when the current pulse was 0.17 mA.

Thereafter, ten elements were maintained at 120° C. for one week while they were being kept in "1" state that a TMR element resistance was high and ten elements were maintained at 120° C. for one week while they were being kept in "0" state that the TMR element resistance was low. As result, reservation of data was confirmed in these elements and the elements each developed desirable characteristics as a nonvolatile magnetic memory. Further, in the double junction reading, a reading signal became 1.6 times the cases of the nineteenth and twentieth embodiments and in the differential reading, a reading signal became 2 times these cases, so that S/N ratio of reading was made excellent and desirable characteristics for a memory were developed.

Twenty-Second Embodiment

Next, a magnetic recording and reproducing apparatus according to a twenty-second embodiment of the present invention will be explained. The magneto-resistance effect element according to the first embodiment which has been explained with reference to FIGS. 1 to 12 and FIG. 36 can be assembled in, for example, a magnetic head assembly of a recording and reproducing integral type and can be mounted in a magnetic recording and reproducing apparatus. In this case, such a structure is employed that the magnetization directions of the magnetization free layer and the magnetization fixed layer of the magneto-resistance effect element are different from the magnetization direction of the magnetic memory and they are substantially perpendicular to each other.

Figure 37:
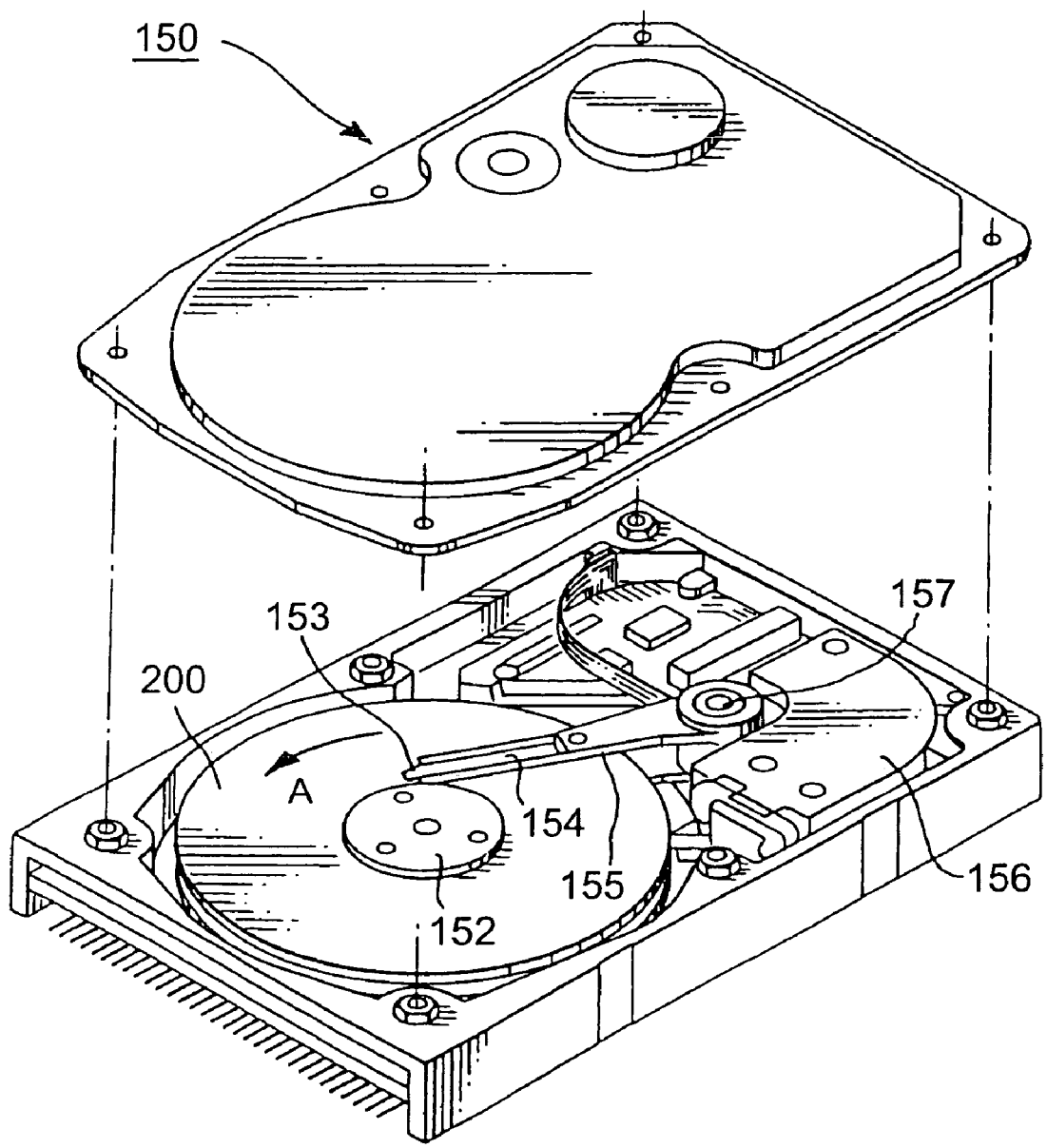
FIG. 37 is a perspective view showing a schematic structure of a principal part of a magnetic recording and reproducing apparatus.

FIG. 37 is a schematic perspective view showing the arrangement of such a magnetic recording and reproducing apparatus. A magnetic recording and reproducing apparatus 150 of the present invention is an apparatus in which a rotary actuator is used. In the drawing, a magnetic disk 200 for lateral or vertical recording is attached to a spindle 152 and is rotated in a direction shown by an arrow A by a motor (not shown) which responds to control signals from an actuator control unit (not shown). The magnetic disk 200 may be configured as "keypad media" which includes a record layer for lateral or vertical recording and further includes a soft magnetic layer deposited thereon. A head slider 153, which is used to record and reproduce information to be stored in the magnetic disk 200, is attached to a tip of a thin film shaped suspension 154. The head slider 153 has the recording/reproducing head in FIG. 30 built in around its tip.

When the magnetic disk 200 is rotated, a surface (ABS) of the head slider 153 opposed to the medium is held apart from the surface of the magnetic disk 200 by a specific lifting distance.

The suspension 154 is connected to one end of an actuator arm 155 which has a bobbin holding actuating coil (not shown). The actuator arm 155 has the other end coupled to a voice coil motor 156 serving as a linear motor. The voice coil motor 156 is comprised of actuating coil (not shown) wound on the bobbin of the actuator arm 155 and a magnetic circuit which has a pair of permanent magnets opposed to each other with the coil being nipped between them, and opposing yokes.

The actuator arm 155 is held by ball bearings (not shown) in upper and lower positions of a fixture shaft 157, and is slidably rotated by the voice coil motor 156.

Figure 38:
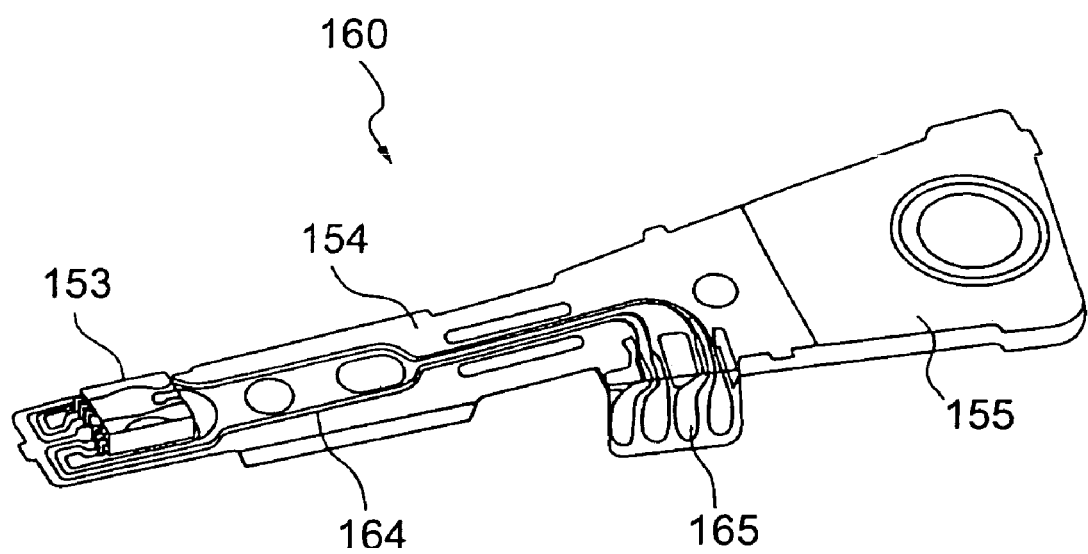
FIG. 38 is an enlarged perspective view of a magnetic head assembly extending from an actuator arm as viewed from a disc side.

FIG. 38 is an enlarged perspective view showing part of the magnetic head assembly ahead of the actuator arm 155, in an orientation seen from the side of the disk. The magnetic head assembly 160 has an actuator arm 151 provided with a bobbin for holding actuating coil, and the actuator arm 155 has its one end connected to the suspension 154.

The head slider 153, which has the aforementioned built-in recording/reproducing head, is attached to a tip of the suspension 154. The suspension 154 has lead lines 164 for writing and reading signals, and the lead lines 164 and electrodes of the magnetic head incorporated in the head slider 153 are electrically connected to one another. In FIG. 38, a reference numeral 165 denotes an electrode pad of the magnetic head assembly 160.

The embodiments of the present invention have been explained above with reference to the specific examples. However, the present invention is not limited to these embodiments. For example, any case that the present invention can be implemented in the same manner as the above and a similar effect or advantage thereof can be achieved by suitable selection of specific material, film thickness, shape, size and the like for a ferromagnetic substance layer, an insulating film, an anti-ferromagnetic substance layer, a non-magnetic metal layer, an electrode or the like constituting the magneto-resistance effect element which are made by those skilled in the art can be included in the scope of the present invention.

Similarly, any case that the present invention can be implemented in the same manner as the above and a similar effect or advantage thereof can be achieved by suitable selection of structure, material, shape and size of each element constituting the magnetic memory of the present invention made by those skilled in the art can be included in the scope of the present invention.

Further, a similar effect or advantage can be obtained by applying the magneto-resistance effect element of the present invention to a magnetic head or magnetic reproducing apparatus of not only a longitudinal magnetic recording system but also a vertical magnetic recording system.

Besides, any magnetic memory which can be changed in design on the basis of the above-described magnetic memories as the embodiments of the present invention to be implemented by those skilled in the art are included in the scope of the present invention.

Incidentally, a sense current controlling element circuit for controlling a sense current caused to flow in the magneto-resistance effect element for reading information stored in the magneto-resistance effect element, a circuit for application of a writing pulse, a driver and the like have not been explained in the above embodiments, but these members can be provided in the magnetic memory of the present invention.

As described above, according to the present invention, power consumption can be reduced and an excellent thermal stability can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magneto-resistance effect element comprising:
 a first ferromagnetic layer serving as a magnetization fixed layer;
 a magnetization free layer comprising a second ferromagnetic layer provided on one side of the first ferromagnetic layer, a third ferromagnetic layer which is formed on an opposite side of the second ferromagnetic layer from the first ferromagnetic layer and has a film face having an area larger than that of the second ferromagnetic layer and whose magnetization direction is changeable by an external magnetic field, and an intermediate layer which is provided between the second ferromagnetic layer and the third ferromagnetic layer; and a tunnel barrier layer provided between the first ferromagnetic layer and the second ferromagnetic layer, the second ferromagnetic layer and the third ferromagnetic layer being magnetically coupled via the intermediate layer, and an aspect ratio of a plane shape of the third ferromagnetic layer being within a range from 1 to 2.

2. The magneto-resistance effect element according to claim 1, further comprising an anti-ferromagnetic layer formed on an opposite side of the first ferromagnetic layer from the tunnel barrier layer.

3. The magneto-resistance effect element according to claim 1, wherein at least one ferromagnetic layer of the first- to third ferromagnetic layers is a stacked film where a ferromagnetic film and a non-magnetic film are stacked alternatively.

4. The magneto-resistance effect element according to claim 1, wherein the intermediate layer is a single-layered ferromagnetic film or a stacked film where a ferromagnetic film and a non-magnetic film are stacked alternatively, and anti-ferromagnetic exchange coupling or ferromagnetic exchange coupling exists, via the non-magnetic film, between the adjacent ferromagnetic films of the stacked film.

5. The magneto-resistance effect element according to claim 1, wherein the second ferromagnetic layer and the intermediate layer have the same film face shape, and the third ferromagnetic layer magnetically contact with the intermediate layer.

6. A magnetic memory comprising a first wiring, a second wiring crossing the first wiring and a magneto-resistance effect element according to claim 1, which is provided in a crossing region of the first and second wirings, wherein the second and third ferromagnetic layers of the magneto-resistance effect element constitute a storage layer whose magnetization direction is changeable according to a magnetic field generated by causing a current to flow in at least one wiring of the first and second wirings, and the third ferromagnetic layer is provided adjacent to the one wiring generating the magnetic field.

7. The magnetic memory according to claim 6, wherein a part of a periphery of the one wiring generating the magnetic field is covered with the third ferromagnetic layer.

8. The magnetic memory according to claim 6, wherein a yoke is provided on an opposite face of the one wiring, to which the third ferromagnetic layer is provided adjacent, from the third ferromagnetic layer.

9. The magnetic memory according to claim 6, further comprising a MOS transistor or a diode for reading storage information in the magneto-resistance effect element.

10. A magnetic head comprising a magneto-resistance effect element according to claim 1 as a magnetic reproducing element.

11. A magneto-resistance effect element comprising:

a first ferromagnetic layer serving as a magnetization fixed layer;

a magnetization free layer which is provided on one side of the first ferromagnetic layer, the magnetization free layer having a T-shape in a section perpendicular to a film face thereof taken along a magnetization easy axis of the magnetization free layer; and a tunnel barrier layer provided between the first ferromagnetic layer and the magnetization free layer, an aspect ratio of a plane shape of the magnetization free layer being within a range from 1 to 2 in any section parallel to the film face thereof.

12. The magneto-resistance effect element according to claim 11, wherein the magnetization free layer comprises a second ferromagnetic layer, a third ferromagnetic layer which is formed on an opposite side of the second ferromagnetic layer from the tunnel barrier layer and has a film face having an area larger than that of the second ferromagnetic layer and whose magnetization direction is changeable by an external magnetic field, and an intermediate layer which is provided between the second ferromagnetic layer and the third ferromagnetic layer and which transmits a change of magnetization direction of the third ferromagnetic layer to the second ferromagnetic layer.

13. The magneto-resistance effect element according to claim 12, wherein the intermediate layer is a single-layered ferromagnetic film or a stacked film where a ferromagnetic film and a non-magnetic film are stacked alternatively, and anti-ferromagnetic exchange coupling or ferromagnetic exchange coupling exists, via the non-magnetic film, between the adjacent ferromagnetic films of the stacked film.

14. The magneto-resistance effect element according to claim 12, wherein the second ferromagnetic layer and the intermediate layer have the same film face shape, and the third ferromagnetic layer magnetically contact with the intermediate layer.

15. The magneto-resistance effect element according to claim 12, wherein the intermediate layer has the same film face shape as the third ferromagnetic layer and is a non-magnetic metal layer.

16. The magneto-resistance effect element according to claim 11, further comprising an anti-ferromagnetic layer formed on an opposite side of the first ferromagnetic layer from the tunnel barrier layer.

17. The magneto-resistance effect element according to claim 11, wherein at least one of the first ferromagnetic layer end the magnetization free layer is a stacked film where a ferromagnetic film and a non-magnetic film are stacked alternatively.

18. A magnetic memory comprising a first wiring, a second wiring crossing the first wiring and a magneto-resistance effect element according to claim 11, which is provided in a crossing region of the fist and second wirings, wherein the magnetization free layer of the magneto-resistance effect element constitutes a storage layer whose magnetization direction is changeable according to a magnetic field generated by causing a current to flow in at least one wining of the first and second wirings, and the magnetization free layer is provided adjacent to the one wiring generating the magnetic field.

19. The magnetic memory according to claim 18, wherein the magnetization free layer comprises a second ferromagnetic layer, a third ferromagnetic layer which is formed on an opposite side of the second ferromagnetic layer from the tunnel barrier layer and has a film face having an area larger than that of the second ferromagnetic layer and whose magnetization direction is changeable by an external magnetic field, and an intermediate layer which is provided between the second ferromagnetic layer and the third ferromagnetic layer and which transmits a change of magnetization direction of the third ferromagnetic layer to the second ferromagnetic layer, and the third ferromagnetic layer is provided adjacent to the one wiring generating the magnetic field.

20. The magnetic memory according to claim 19, wherein a part of a periphery of the one wiring generating the magnetic field is covered with the third ferromagnetic layer.

21. The magnetic memory according to claim 19, wherein a yoke is provided on an opposite face of the one wiring, to which the third ferromagnetic layer is provided adjacent, from the third ferromagnetic layer.

22. The magnetic memory according to claim 18, further comprising a MOS transistor or a diode for reading storage information in the magneto-resistance effect element.

23. A magnetic head comprising a magneto-resistance effect element according to claim 11 as a magnetic reproducing element.

* * * * *